(12) United States Patent
Mizuguchi

(10) Patent No.: US 9,979,920 B2
(45) Date of Patent: May 22, 2018

(54) SOLID-STATE IMAGE DEVICE, IMAGE DATA TRANSMISSION METHOD, AND CAMERA SYSTEM WITH A SINGLE-END DRIVER AND DIFFERENTIAL DRIVER

(71) Applicant: Renesas Electronics Corporation, Tokyo (JP)

(72) Inventor: Tatsuya Mizuguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/489,454

(22) Filed: Apr. 17, 2017

(65) Prior Publication Data

US 2017/0251157 A1 Aug. 31, 2017

Related U.S. Application Data

(63) Continuation of application No. 14/754,341, filed on Jun. 29, 2015, now Pat. No. 9,635,301.

(30) Foreign Application Priority Data

Jul. 9, 2014 (JP) .................................. 2014-141430

(51) Int. Cl.
   *H04N 5/378* (2011.01)
   *H04N 5/3745* (2011.01)
(52) U.S. Cl.
   CPC ........... *H04N 5/378* (2013.01); *H04N 5/3745* (2013.01)
(58) Field of Classification Search
   CPC .. H04N 5/378; H04N 5/3745; H04L 25/0272; H04L 25/0264
   See application file for complete search history.

(56) References Cited

U.S. PATENT DOCUMENTS

| 6,836,290 | B1 | 12/2004 | Chung et al. |
| 7,843,224 | B2 | 11/2010 | Suenaga et al. |
| 8,050,332 | B2* | 11/2011 | Chung ................ H04L 25/0264 375/244 |
| 8,203,976 | B2* | 6/2012 | Komoda ................ G03G 15/50 370/276 |
| 8,446,988 | B2* | 5/2013 | Chung ................ H04L 25/0264 375/340 |
| 8,654,864 | B2* | 2/2014 | Chung ................ H04L 25/0264 375/244 |
| 2008/0170604 | A1* | 7/2008 | Komoda ................ G03G 15/50 375/214 |
| 2013/0163692 | A1* | 6/2013 | Chung ................ H04L 25/0264 375/295 |

FOREIGN PATENT DOCUMENTS

| JP | 2000-353035 A | 12/2000 |
| JP | 2009-111794 A | 5/2009 |

* cited by examiner

*Primary Examiner* — Nicholas Giles
(74) *Attorney, Agent, or Firm* — McGinn IP Law Group, PLLC

(57) ABSTRACT

A solid-state imaging device includes a pixel array, an AD converting unit converting each of a plurality of analog signals read from the pixel array to a plurality of digital signals and outputting the digital signals, a transmission mode selection register, first and second output terminals, a single-end driver which has first and second input terminals coupled to the digital signals and which has third and fourth terminals, and a differential driver which has third and fourth input terminals coupled to the digital signals and which has fifth and sixth terminals.

1 Claim, 28 Drawing Sheets

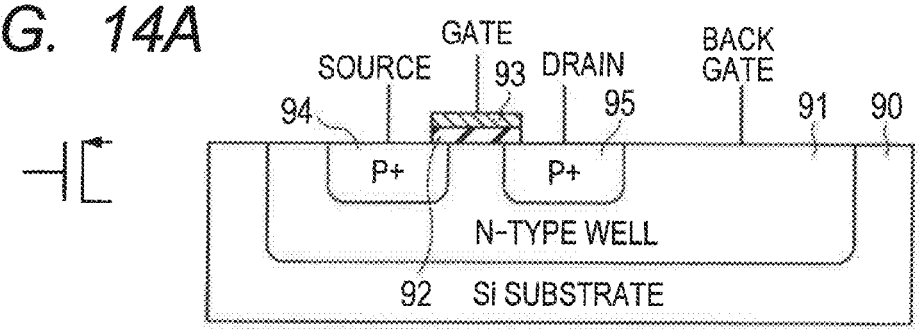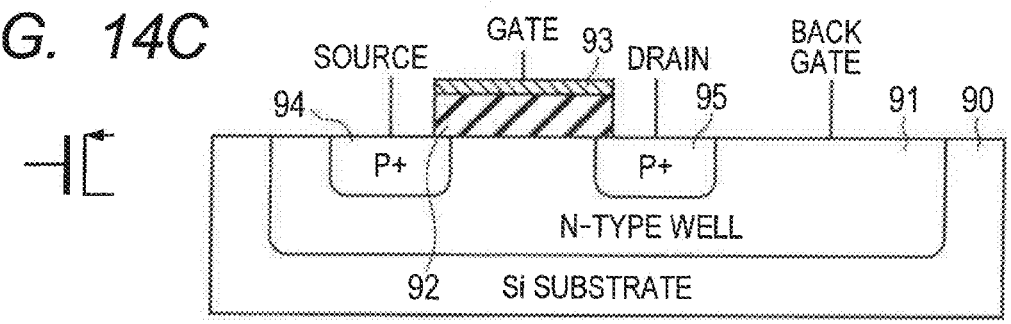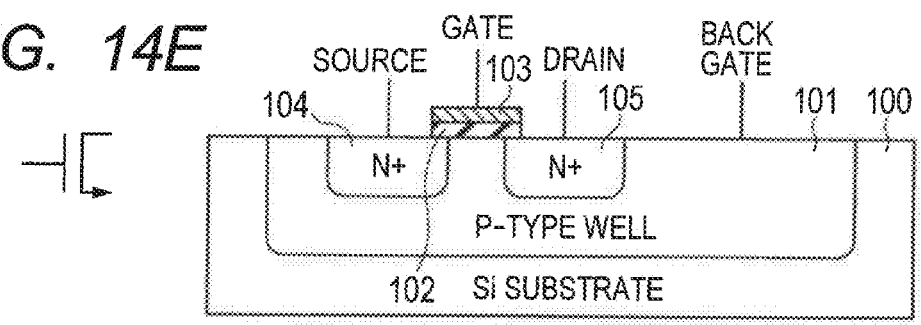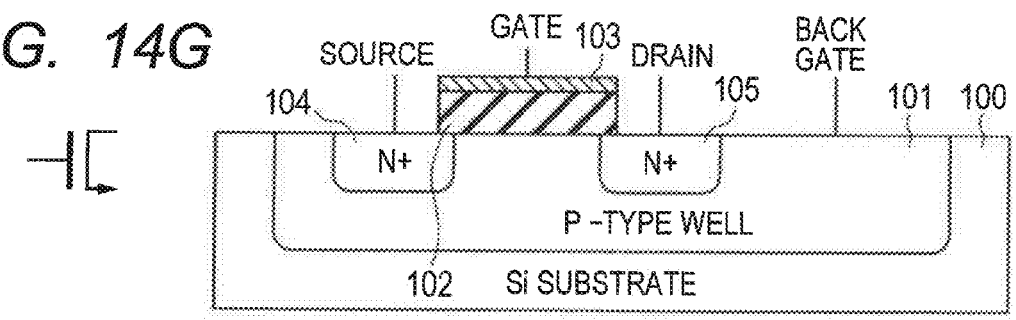

FIG. 16

UNIT [V]

|  |  | PARALLEL TRANSMISSION | | | | SERIAL TRANSMISSION | |
|---|---|---|---|---|---|---|---|
|  |  | STATE A | STATE B | STATE C | STATE D | STATE E | STATE F |
| No.1 | VOLTAGE OF NODE N11 | 0 | 0 | 1.5 | 1.5 | 0 | 0 |
| No.2 | VOLTAGE OF NODE N12 | 0 | 1.5 | 0 | 1.5 | 0 | 0 |
| No.3 | VOLTAGE OF NODE N1 | 1.5 | 1.5 | 1.5 | 1.5 | 0 | 1.5 |
| No.4 | VOLTAGE OF NODE N2 | 1.5 | 1.5 | 1.5 | 1.5 | 1.5 | 0 |
| No.5 | VOLTAGE OF OUTPUT TERMINAL TO1 | 0 | 0 | 1.8 | 1.8 | 0.8 | 1.0 |
| No.6 | VOLTAGE OF OUTPUT TERMINAL TO2 | 0 | 1.8 | 0 | 1.8 | 1.0 | 0.8 |
| No.7 | STATE OF TRANSISTOR P1 | OFF | ON | OFF | ON | ON | OFF |
| No.8 | STATE OF TRANSISTOR P2 | OFF | OFF | ON | ON | OFF | ON |
| No.9 | STATE OF TRANSISTOR P3 | OFF | ON | OFF | ON | OFF | ON |
| No.10 | STATE OF TRANSISTOR P4 | OFF | OFF | ON | ON | ON | OFF |
| No.11 | BACK GATE VOLTAGE VBG | 1.8 | 1.8 | 1.8 | 1.8 | 1.0 | 1.0 |
| No.12 | STATE OF DIODE 111 | OFF | OFF | OFF | OFF | OFF | OFF |
| No.13 | STATE OF DIODE 112 | OFF | OFF | OFF | OFF | OFF | OFF |
| No.14 | STATE OF DIODE 113 | OFF | OFF | OFF | OFF | OFF | OFF |
| No.15 | STATE OF DIODE 114 | OFF | OFF | OFF | OFF | OFF | OFF |
| No.16 | VBG − V1 | 0.3 | 0.3 | 0.3 | 0.3 | 1.0 | 0.5 |
| No.17 | VBG − V2 | 0.3 | 0.3 | 0.3 | 0.3 | 0.5 | 1.0 |

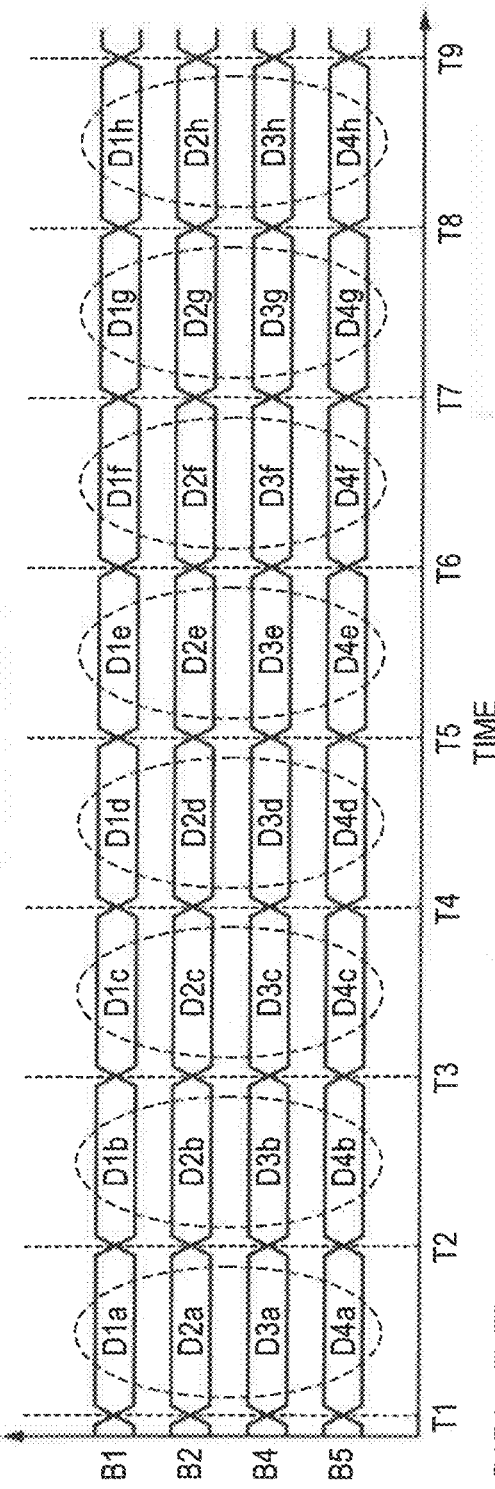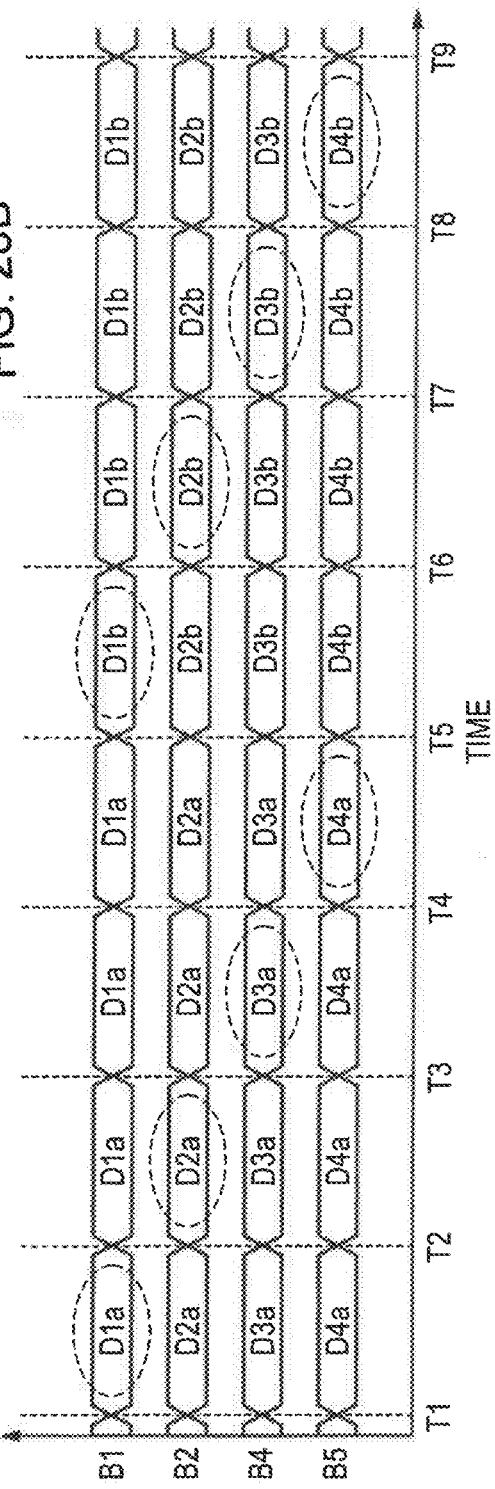

SOLID-STATE IMAGE DEVICE, IMAGE DATA TRANSMISSION METHOD, AND CAMERA SYSTEM WITH A SINGLE-END DRIVER AND DIFFERENTIAL DRIVER

This application is a Continuation application of U.S. patent application Ser. No. 14/754,341, which was filed on Jun. 29, 2015, and the disclosure of which is incorporated herein in its entirety by reference thereto.

CROSS-REFERENCE TO RELATED APPLICATIONS

The disclosure of Japanese Patent Application No. 2014-141430 filed on Jul. 9, 2014 including the specification, drawings and abstract is incorporated herein by reference in its entirety.

BACKGROUND

The present invention relates to a solid-state imaging device, an image data transmission method, and a camera system.

In the technical field of a surveillance camera or the like, for communication between a solid-state imaging device (as an example, a CMOS image sensor) and an image processing engine, data transmission modes of different types such as a serial transmission mode and a parallel transmission mode exist. A semiconductor device including an imaging device has to be adapted to those different data transmission modes.

Patent literature 1 discloses a signal communication interface in which a single-end type and a differential type are integrated.

Patent literature 2 discloses an interface circuit in which a single-end transmission and a differential transmission can be switched.

RELATED ART LITERATURE

Patent Literature

Patent literature 1: Japanese Unexamined Patent Application Publication No. 2000-353035
Patent Literature 2: Japanese Unexamined Patent Application Publication No. 2009-111794

SUMMARY

The inventors of the present invention examined a solid-state imaging device in which an image data output terminal is commonly used in different data transmission modes such as a parallel transmission mode and a serial transmission mode.

The other challenges and novel features will become apparent from the description of the present specification and the appended drawings.

As an embodiment, a single-end driver outputting first and second single-end signals to first and second output terminals, respectively, on the basis of a plurality of digital signals in a parallel transmission mode and a differential driver outputting a positive signal and a negative signal configuring differential signals to the first and second output terminals, respectively, on the basis of a plurality of digital signals in a parallel transmission mode are provided.

According to the embodiment, data transmission speed by the differential signals can be increased.

BRIEF DESCRIPTION OF THE DRAWINGS

FIGS. 14A to 14H are diagrams illustrating the configuration of a thin film transistor and a thick film transistor.

FIG. 16 is a diagram illustrating change states of voltages of output terminals of the driver depicted in FIG. 15 and the like.

FIG. 28A is a timing chart illustrating operations in the serial transmission mode of the CMOS image sensor depicted in FIG. 26, and FIG. 28B is a timing chart illustrating operations in the parallel transmission mode of the CMOS image sensor depicted in FIG. 26.

DETAILED DESCRIPTION

First Embodiment

Figure 1:
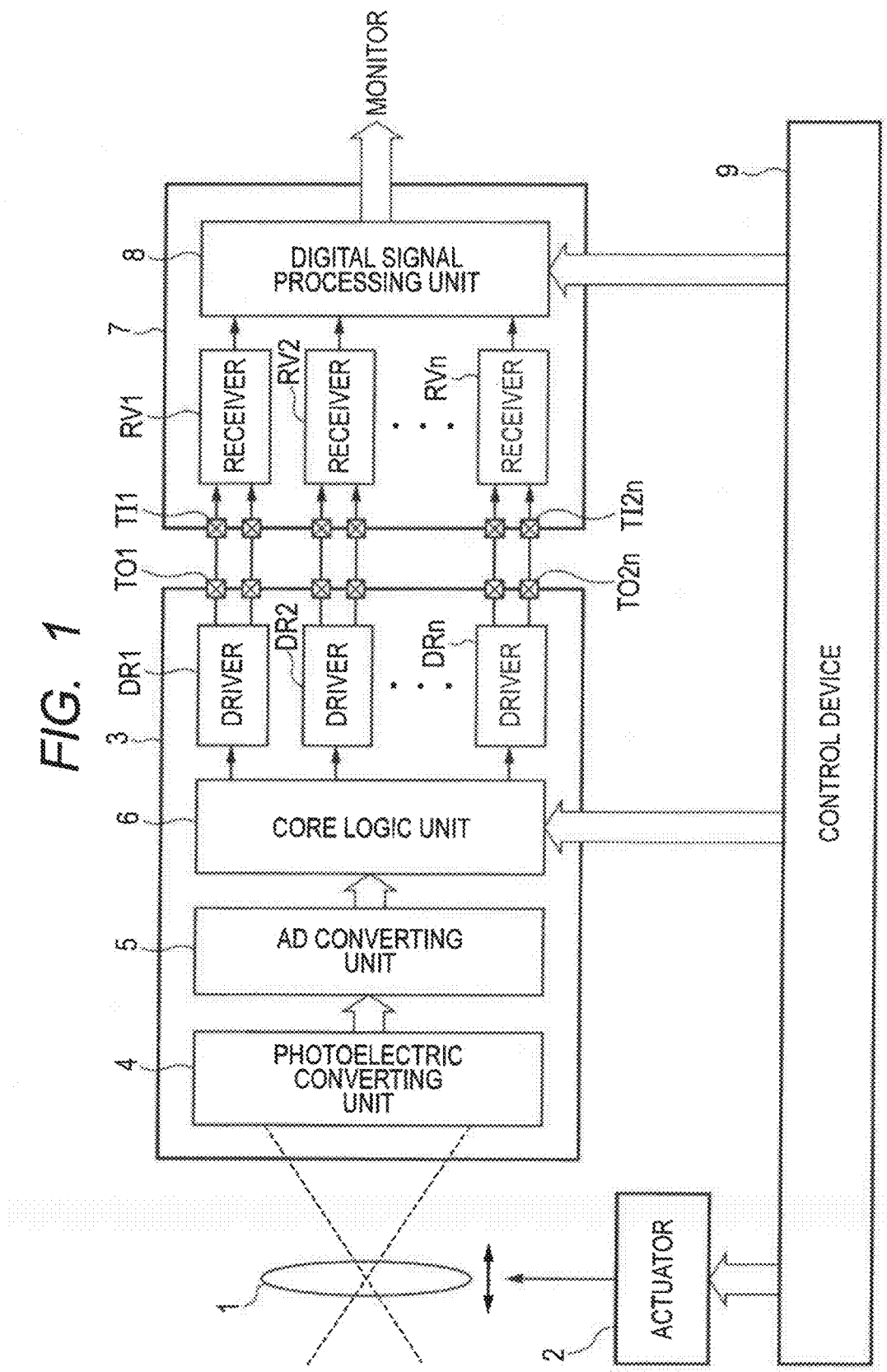
FIG. 1 is a block diagram illustrating a general configuration of a camera system according to a first embodiment of the present application.

FIG. 1 is a block diagram illustrating a general configuration of a camera system according to a first embodiment. In FIG. 1, the camera system includes a lens 1, an actuator 2, a CMOS (Complementary Metal Oxide Semiconductor) image sensor 3, an image processing engine 7, and a control device 9. The lens 1 is used to widen/narrow an imaging range and to focus on a subject. The actuator 2 includes a driving unit which is controlled by the control device 9 and moves the lens 1. As solid-state imaging devices, a CMOS image sensor, a CCD image sensor, and the like exist. The embodiment will be described using a CMOS image sensor as an example.

The CMOS image sensor 3 is controlled by the control device 9 and outputs an electric signal indicating a captured image to the image processing engine 7. The CMOS image sensor 3 has a parallel transmission mode of outputting an electric signal as a single-end signal of the CMOS interface standard to the image processing engine 7 and a serial transmission mode of outputting an electric signal as a differential signal of the SubLVDS standard. The CMOS image sensor 3 is configured as a solid-state imaging device. The SubLVDS standard is a standard whose data transmission speed is faster than that of the LVDS standard.

The CMOS image sensor 3 includes a photoelectric converting unit 4, an AD converting unit 5, a core logic unit 6, n pieces (n is an integer of two or larger) of drivers DR1 to DRn, and 2n pieces of output terminals TO1 to TO2n. The photoelectric converting unit 4 includes a plurality of pixels arranged in a plurality of rows and a plurality of columns. Each pixel converts incident light to an analog signal. The analog signal has a voltage of a level according to the intensity of the incident light. The photoelectric converting unit 4 sequentially outputs a plurality of analog signals generated by the plurality of pixels to the AD converting unit 5.

The AD converting unit 5 converts the voltages of the plurality of analog signals output from the photoelectric converting unit 4 to a plurality of data signals (digital signals). The plurality of data signals are divided by 2n pieces into m pieces of groups (m is an integer of 1 or larger and less than n). The AD converting unit 5 outputs m×2n pieces of data signals. FIG. 1 illustrates the case where m=n.

The core logic unit 6 can select a method of transmitting an electric signal from the CMOS image sensor 3 to the image processing engine 7 from two transmission modes of the parallel transmission mode and the serial transmission mode in accordance with a set value which is stored in a transmission mode setting register on the basis of a control signal from an external terminal or the like. Alternatively, the transmission modes can be selected in accordance with a set value which is stored in another storing means such as a ROM in the CMOS image sensor.

In the parallel transmission mode, the core logic unit 6 supplies data signals of m groups which are output in parallel from the AD converting unit 5 group by group to the n pieces of drivers DR1 to DRn in parallel. Two pieces of the 2n pieces of data signals in each group are supplied in parallel to each of the n pieces of drivers DR1 to DRn. In the serial transmission mode, the core logic unit 6 supplies the data signals in the m groups which are output in parallel from the AD converting unit 5 to the m pieces of drivers DR1 to DRm. The 2n pieces of data signals of each group are supplied in series to the corresponding driver DR.

In the parallel transmission mode, the 2n pieces of data signals of one group are transmitted in one cycle of a reference clock signal, and the 2n pieces of data signals in the m groups are transmitted in m cycles of the reference clock signal. In the serial transmission mode, the 2n pieces of data signals of the m groups are transmitted in one cycle of the reference clock signal. Therefore, the data transfer speed in the serial transmission mode becomes m times as fast as the data transmission speed in the parallel transmission mode.

In the parallel transmission mode, each of the drivers DR outputs one of two data signals supplied in parallel from the core logic unit 6 as a single-end signal of the CMOS interface standard to an output terminal TO as one of corresponding output terminals TO, and outputs the other data signal as a single-end signal of the CMOS interface standard to the other output terminal TO. In the serial transmission mode, each of the drivers DR outputs each of the 2n pieces of data signals supplied in series from the core logic unit 6 as a differential signal of the SubLVDS standard to corresponding two output terminals TO.

The image processing engine 7 includes 2n pieces of input terminals TI1 to TI2n, n pieces of receivers RV1 to RVn, and a digital signal processing unit 8. The input terminals TI1 to TI2n are coupled to the output terminals TO1 to TO2n, respectively. The receivers RV1 to RVn receive 2n pieces of data signals supplied from the CMOS image sensor 3 via the input terminals TI1 to TI2n and supply them to the digital signal processing unit 8. In the case where the image processing engine 7 employs the single-end transmission type, the CMOS image sensor 3 is set in the parallel transmission mode. In the case where the image processing engine 7 employs the SubLVDS system, the CMOS image sensor 3 is set in the serial transmission mode.

The digital signal processing unit 8 performs various processes such as a color process and a correcting process on the 2n pieces of data signals from the receivers RV1 to RVn, further, performs encoding (for example, signal conversion to the NTSC system) for displaying an image on a monitor (not illustrated), and supplies the resultant signals to the monitor. On the monitor, an image of the subject captured is displayed. The control device 9 is configured by, for example, a microcomputer and controls the entire camera system. In the serial transmission mode, the data signal can be transmitted at higher speed than in the parallel transmission mode, and the frame rate can be made higher.

Description of Operation of CMOS Image Sensor

Figure 2:
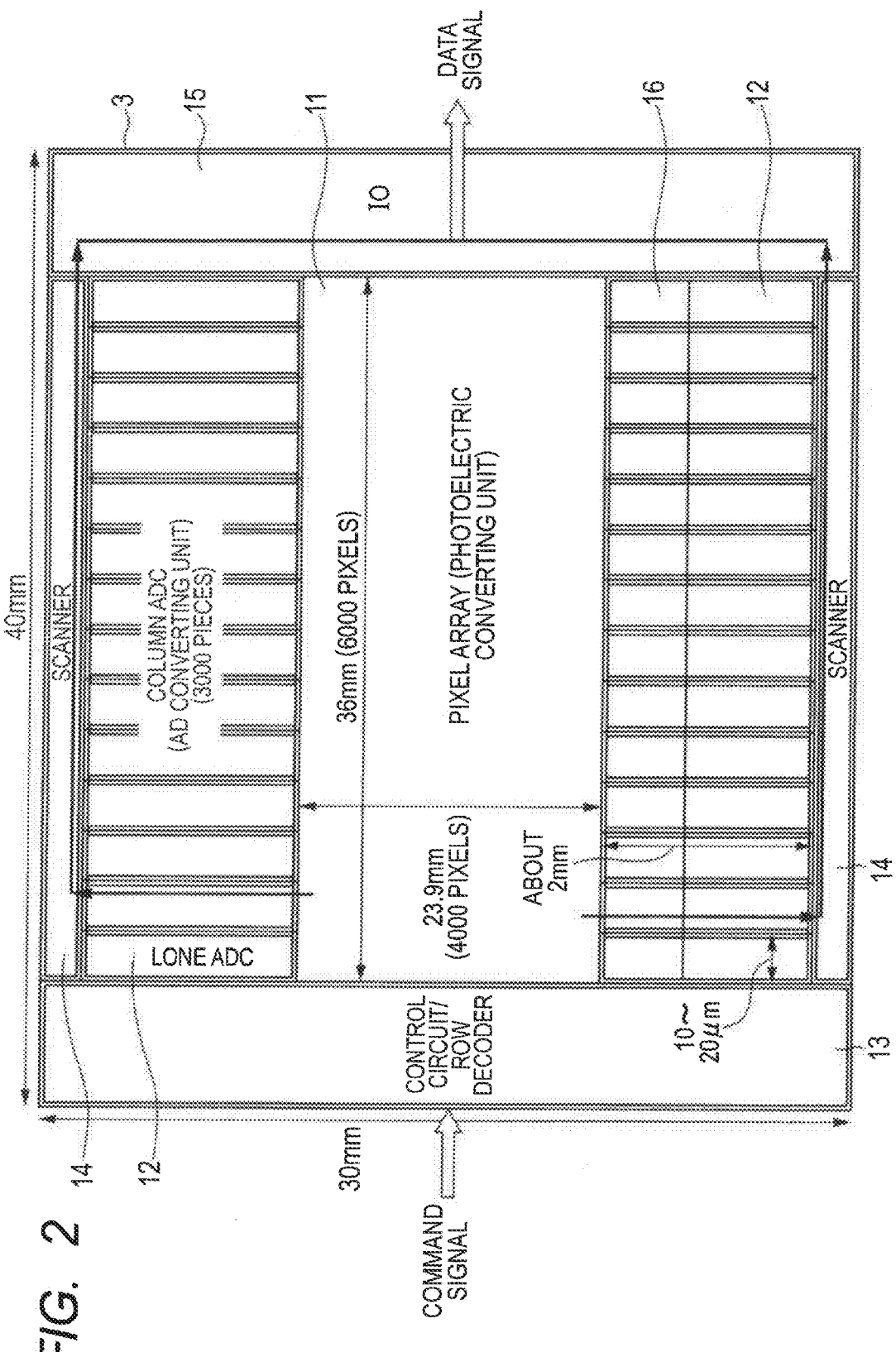
FIG. 2 is a block diagram illustrating the configuration of a CMOS image sensor depicted in FIG. 1.

FIG. 2 is a block diagram illustrating a main part of the CMOS image sensor 3. In FIG. 2, the CMOS image sensor 3 includes a pixel array 11, column ADCs 12 and PGAs (Programmable Gain Amplifiers) 16 arranged in columns of the pixels, a control circuit/row decoder 13 performing general control of the CMOS image sensor 3 and a selecting process in the row direction of the pixel array 11, a scanner 14 transferring digital signals output from the column ADCs 12 in the horizontal direction, and an I/O (Input/Output) unit 15 outputting the digital signals transferred by the scanner 14 to the outside of the chip. The pixel array 11 corresponds to the photoelectric converting unit 4 in FIG. 1, the column ADC 12 corresponds to the AD converting unit 5, and the I/O unit 15 includes the core logic unit 6, the drivers DR1 to DRn, and the output terminals TO1 to TO2n.

The width of the CMOS image sensor 3 is about 40 mm, and 6,000 pieces of pixels in the horizontal direction are arranged in the width of 36 mm in the width of about 40 mm. The height of the CMOS image sensor 3 is about 30 mm, and 4,000 pixels in the vertical direction are arranged in the height of 23.9 mm in the height of about 30 mm.

The column ADCs 12 are arranged on the upper and lower sides of the pixel array 11, and one column ADC 12 is arranged in the width of the pixels in two columns. Therefore, 3,000 pieces of the column ADCs 12 are arranged on each of the upper and lower sides of the pixel array 11.

Since the width of the column ADC 12 and the PGA 16 is twice as wide as that of the pixel pitch, it becomes the width of about 10 to 20 µm. Since the sum of heights of the column ADC 12 and the PGA 16 is about 2 mm, the shape is very elongated. The column ADC 12 has to be designed under this restriction, so that a simple circuit configuration with a small area is resulted, and electric power saving is necessary.

Figure 3:
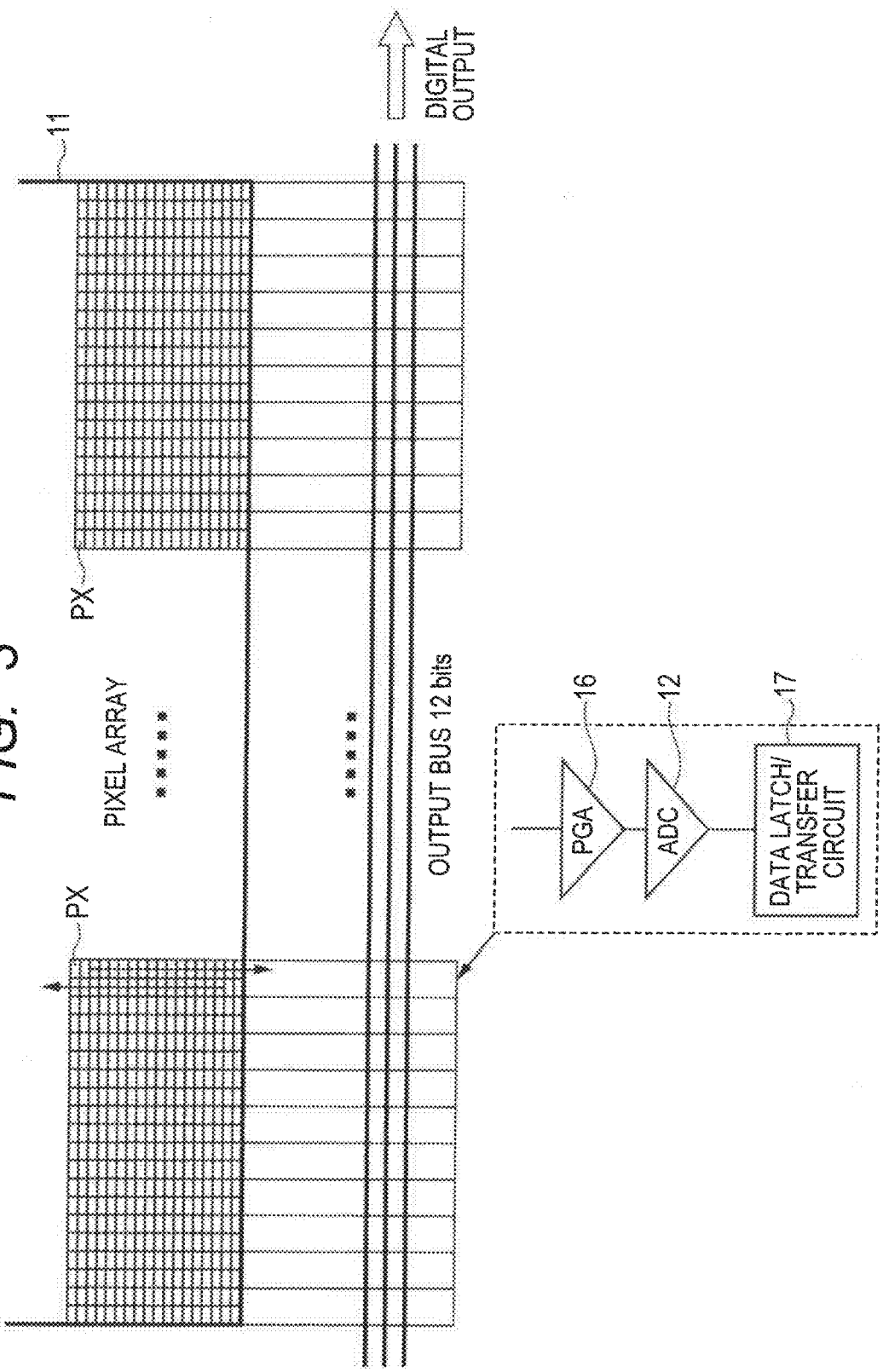
FIG. 3 is a block diagram illustrating the configuration of a pixel array and a column circuit depicted in FIG. 2.

FIG. 3 is an enlarged diagram illustrating a part of the pixel array 11 in the CMOS image sensor 3 and the column circuit depicted in FIG. 2. One column circuit is provided for two columns of the pixels PX in the pixel array 11, and each column circuit includes the ADC 12, the PGA (Programmable Gain Amplifier) 16, and the data latch/transfer circuit 17.

The PGA 16 amplifies pixel outputs sequentially transmitted from the pixels PX in the column direction and outputs the amplified pixel outputs to the ADC 12. The ADC 12 converts the analog signals received from the PGA 16 to a plurality of data signals and outputs the data signals to the data latch/transfer circuit 17. The data latch/transfer circuit 17 sequentially shifts the digital values of the pixel outputs in the row direction and outputs data signals of 3,000 pixels to the outside. A similar circuit is arranged also on the upper side of the pixel array 11.

Figure 4:
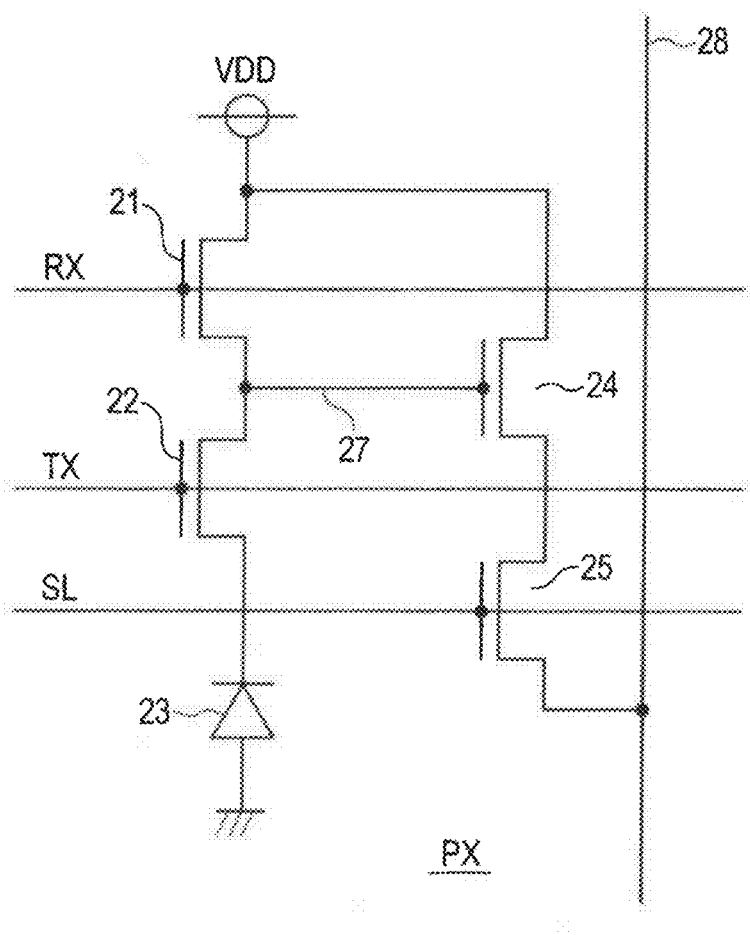
FIG. 4 is a circuit diagram illustrating the configuration of a pixel PX depicted in FIG. 3.

FIG. 4 is a circuit diagram illustrating the configuration of the pixel PX depicted in FIG. 3. The pixel PX includes a photodiode 23 converting a light signal to an electric signal, a transfer transistor 22 transmitting the electric signal generated by the photodiode 23 in accordance with a transfer control signal TX on a transfer control line, and a reset transistor 21 resetting a floating diffusion 27 to a predetermined voltage level in accordance with the reset control signal RX on the reset control line.

Further, the pixel PX also includes a source-follower transistor 24 transmitting power supply voltage VDD on the power supply node in a source-follower mode in accordance with a signal potential on the floating diffusion 27, and a row-selection transistor 25 transmitting the signal transmitted by the source-follower transistor 24 onto a vertical read line 28 in accordance with a row selection signal SL on a row selection control line. The transistors 21, 22, 24, and 25 are, as an example, N-channel MOS transistors. Therefore, the pixel PX is a pixel of the CMOS image sensor.

Figure 5:
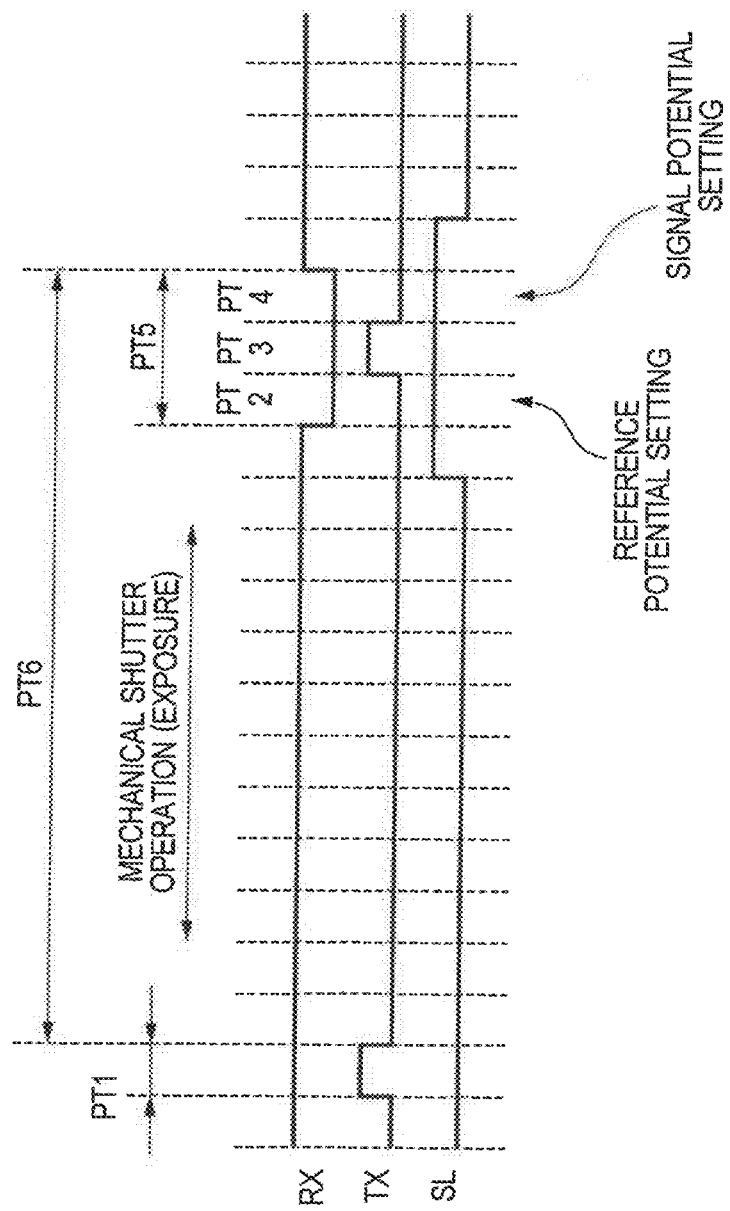
FIG. 5 is a timing chart illustrating operations at the time of reading signals of the pixel PX depicted in FIG. 4.

FIG. 5 is a timing chart for explaining operations at the time of reading signals of the pixel PX depicted in FIG. 4. Hereinbelow, with reference to FIG. 5, the signal reading operation of the pixel PX illustrated in FIG. 4 will be described.

In a period PT1, in a state where the rest control signal RX is at the high level (hereinbelow, described as the "H" level), the transfer control signal TX is set to the "H" level. Both the reset transistor 21 and the transfer transistor 22 enters an on state and the electric signal converted by the photodiode 23 is initialized. That is, in the photodiode 23, charges accumulated by photoelectric conversion in the preceding cycle are released.

When the transfer control signal TX becomes a low level (hereinbelow, called the "L" level" and the transfer transistor 22 enters an off state, a photoelectric converting operation in the photodiode 23 is performed again, and signal charges are accumulated. In this state, the reset control signal RX maintains the "H" level, and the reset transistor 21 maintains the on state. When the reset control signal RX is at the power supply voltage VDD level, the floating diffusion 27 is maintained at a voltage level lower than the voltage supply voltage VDD only by the amount of a threshold voltage of the reset transistor 21.

Subsequently, first, the row selection signal SL becomes the "H" level, the row selection transistor 25 is turned on and, by a source follower operation of the source-follower transistor 24, a signal of a potential according to the potential on the floating diffusion 27 is transmitted onto the vertical read line 28. After that, a pixel read period PT5 starts.

In the pixel read period PT5, first, in a period PT2, the reset control signal RX becomes the "L" level and the reset transistor 21 becomes the off state. A signal according to the signal potential on the floating diffusion 27 is transmitted onto the vertical read line 28 and a capacitive device for reference included in a not-illustrated read circuit is charged. In the period PT2, a reference potential of a signal of the pixel PX is set. The setting corresponds to sampling of information of a dark state of a pixel which will be described later.

Subsequently, in a period PT3, The transfer control signal TX becomes the "H" level, the transfer transistor 22 is turned on, and charges accumulated by photoelectric conversion by the photodiode 23 are transmitted to the floating diffusion 27. Accordingly, the potential of the vertical read line 28 changes to a potential according to the charges from the pixel. When the transfer control signal TX changes to the "L" level, according to the potential on the vertical read line 28, a signal charge accumulation capacitive device included in the not-illustrated read circuit is charged in the period PT4. This corresponds to sampling of information in a light state of a pixel which will be described later.

Subsequently, a reference potential and a signal potential read in the periods PT2 and PT4, respectively, are differential-amplified, and a signal of the pixel PX (pixel signal) is read.

By performing sampling twice for one pixel and comparing an initial potential and a signal potential, a so-called correlated double sampling operation is performed to cancel off the influence of noise in the pixel PX and an electric signal generated by the photodiode 23 is read.

After reading of the signal of the pixel PX is completed, the row selection signal SL becomes the "L" level, and the row selection transistor 25 enters the off state.

The pixels PX are arranged in the array, and pixel signals are read in parallel on pixels in one row. In the pixel PX, during a period since completion of the reset period PT1 until completion of the read period PT5, in the photodiode 23, a light signal is converted to an electric signal to generate a signal charge.

As illustrated in FIG. 4, the pixel PX is constructed by the photodiode 23 and the N-channel MOS transistor, and a pixel signal is read onto the vertical read line 28 via the row selection transistor 25. Therefore, different from the CCD image sensor, the order of selecting the row selection transistor 25 and the vertical read line 28 can be set at random.

Figure 6:
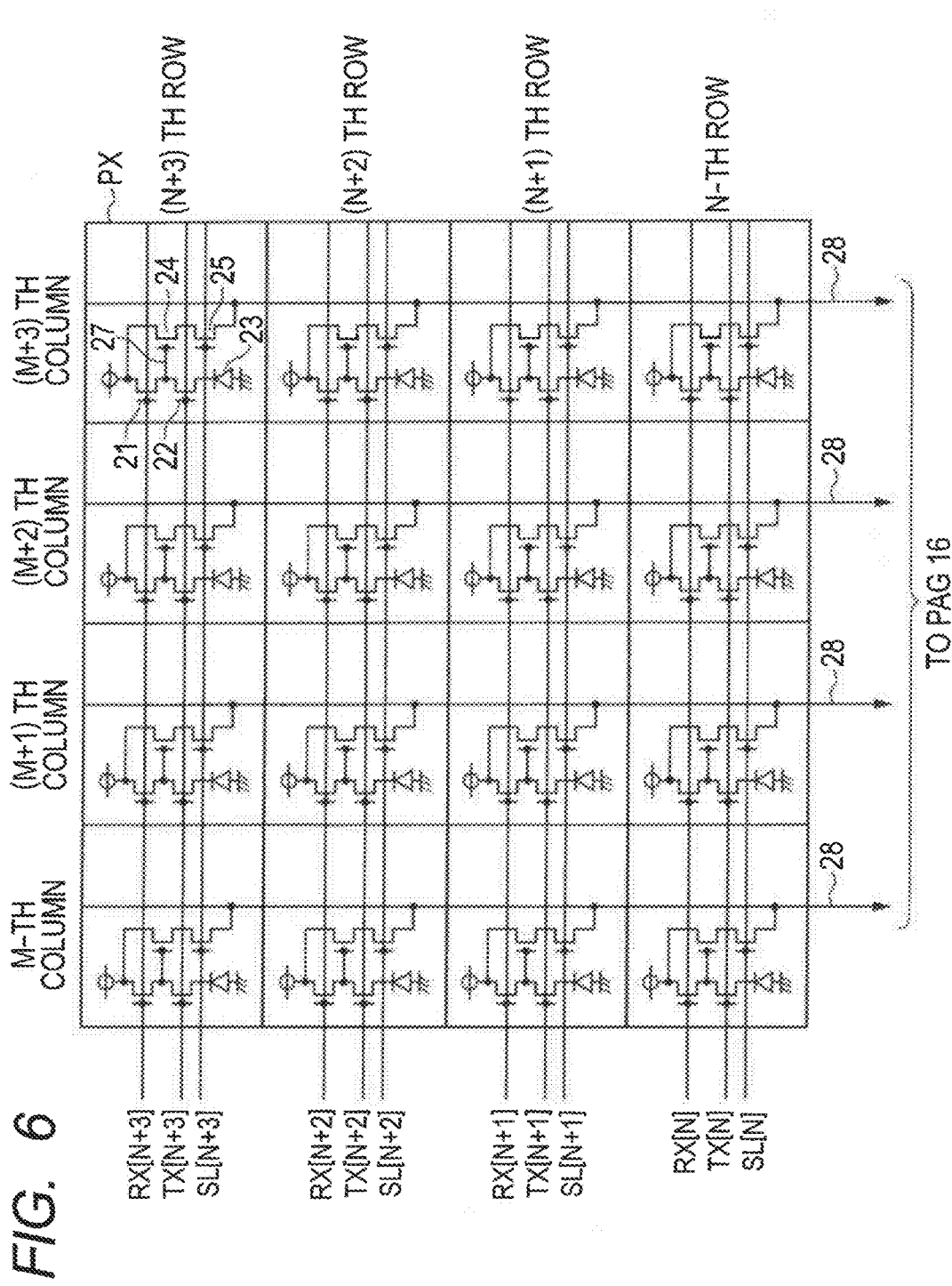
FIG. 6 is a circuit diagram illustrating a main part of the pixel array depicted in FIG. 2.

FIG. 6 is a circuit diagram illustrating a main part of the pixel array 11. In FIG. 6, pixels PX arranged in four rows from the N-th row to the (N+3)th row and four columns from the M-th column to the (M+3)th column are illustrated representatively. The pixel PX has the same configuration as that of the pixel PX illustrated in FIG. 4.

The pixels PX are arranged in a matrix shape and a set of a reset control signal RX[i], a transfer control signal TX[i], and a row selection signal SL[i] is given to each row. i is any number from N to N+3. The vertical read line 28 is arranged for each column.

Figure 7:
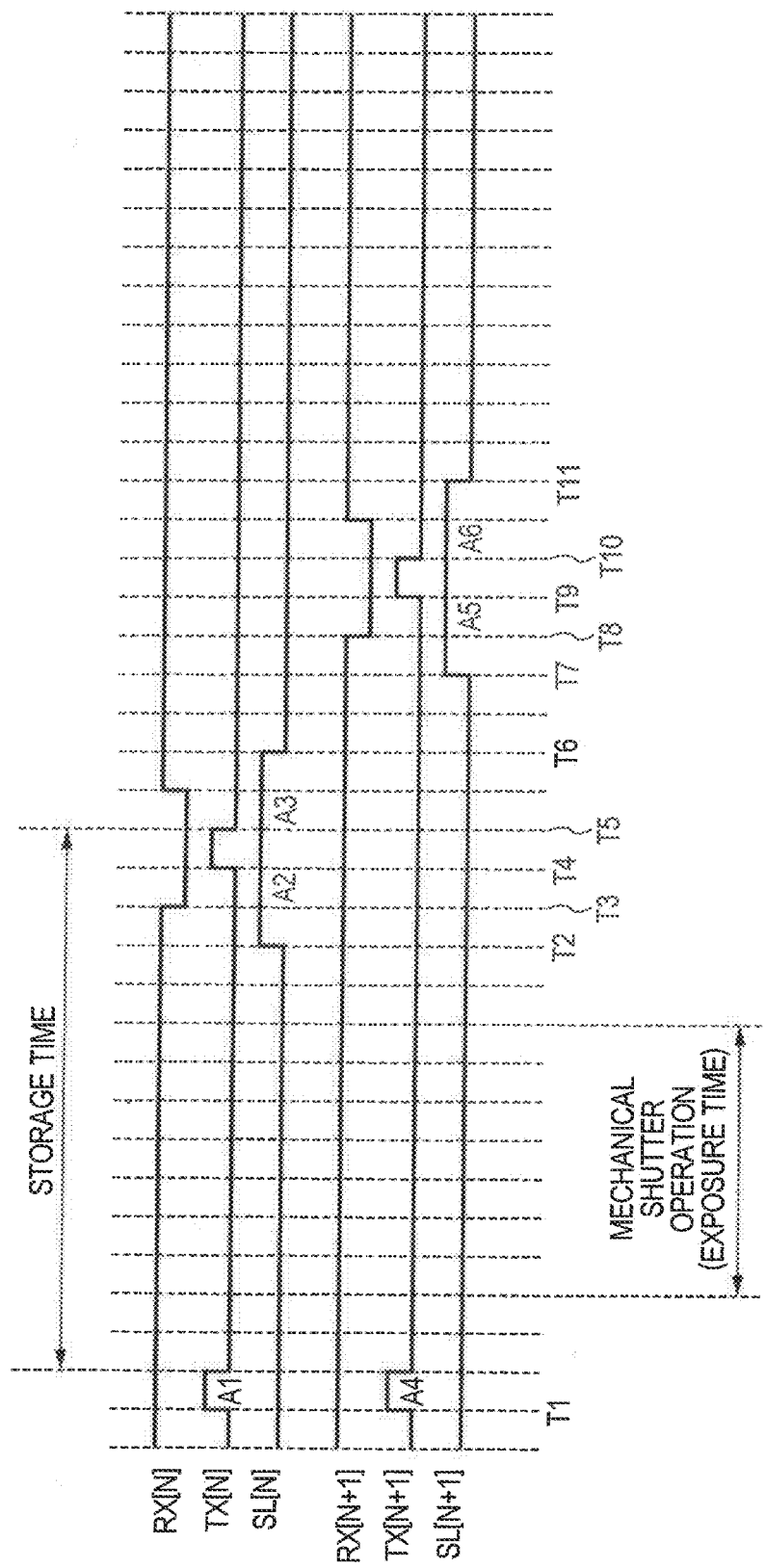
FIG. 7 is a timing chart illustrating operations at the time of reading data of the pixel array depicted in FIG. 6.

FIG. 7 is a timing chart illustrating operations at the time of reading data of the pixel array 11 depicted in FIG. 6. Hereinbelow, with reference to FIG. 7, the pixel signal reading operation of the pixel array 11 illustrated in FIG. 6 will be described.

At time T1, the transfer control signals TX[N] and TX[N+1] for the N+th and (N+1)th rows are driven to the "H" level. The reset control signals RX[N] and RX[N+1] are at the "H" level and the reset transistor 21 is in the on state. In periods A1 and A4 starting from the time T1, charges accumulated in the photodiode 23 are released in the N-th and (N+1)th rows and, accordingly, the floating diffusion 27 illustrated in FIG. 4 is reset to a predetermined initial voltage level in the N-th and (N+1)th rows.

After predetermined time elapses, at time T2, the row selection signal SL[N] for the N-th row rises to the "H" level. In response to this, the row selection transistor 25 in the pixel PX enters the on state, and the source follower transistor 24 is coupled to the corresponding vertical read line 28.

Subsequently, the reset control signal RX[N] falls to the "L" level, the reset transistor 21 enters the off state in each of the pixels in the N-th row, and the floating diffusion 27 is maintained at the reset potential level.

At time T4, the transfer control signal TX[N] becomes the "H" level, the transfer transistor 22 enters the on state in the pixels in the N-th row, and the signal charges generated by the photodiode 23 are transmitted to the floating diffusion 27. The row selection signal SL[N] is at the "H" level at this time, and the pixel signals are read to each of the vertical read lines 28 in accordance with the potential of the floating diffusion 27.

After completion of the operation of reading the pixels in the N-th row, the reset control signal RX[N] becomes the "H" level, and the floating diffusion 27 is charged again to the initial voltage level via the reset transistor 21.

At time T6, the row selection signal SL[N] becomes the "L" level, the row selection transistor 25 enters the off state, and the reading of the signal charges in the pixels in the N-th row is completed.

Subsequently, signals of the pixels in the [N+1]th row are read. Specifically, at time T7, a row selection signal SL[N+1] rises to the "H" level, and the source follower transistor 24 in the pixel PX in the (N+1)th row is coupled to the corresponding vertical read line 28.

Subsequently, at time T8, the reset control signal RX[N+1] becomes the "L" level, and an additional operation for the floating diffusion 27 is completed.

At time T9, a transfer control signal TX[N+1] becomes the "H" level, the potential of the floating diffusion 27 changes in accordance with the signal charges generated by the photodiode 23, and the pixel signal is read onto the vertical read line 28 in accordance with the potential.

At time T11, a row selection signal SL[N+1] falls to the "L" level, and reading of the pixels in the N-th and (N+1)th rows is completed. By repeating the above operations, the information in the pixels in the column direction is sequentially output to the PGA 16.

Figure 8:
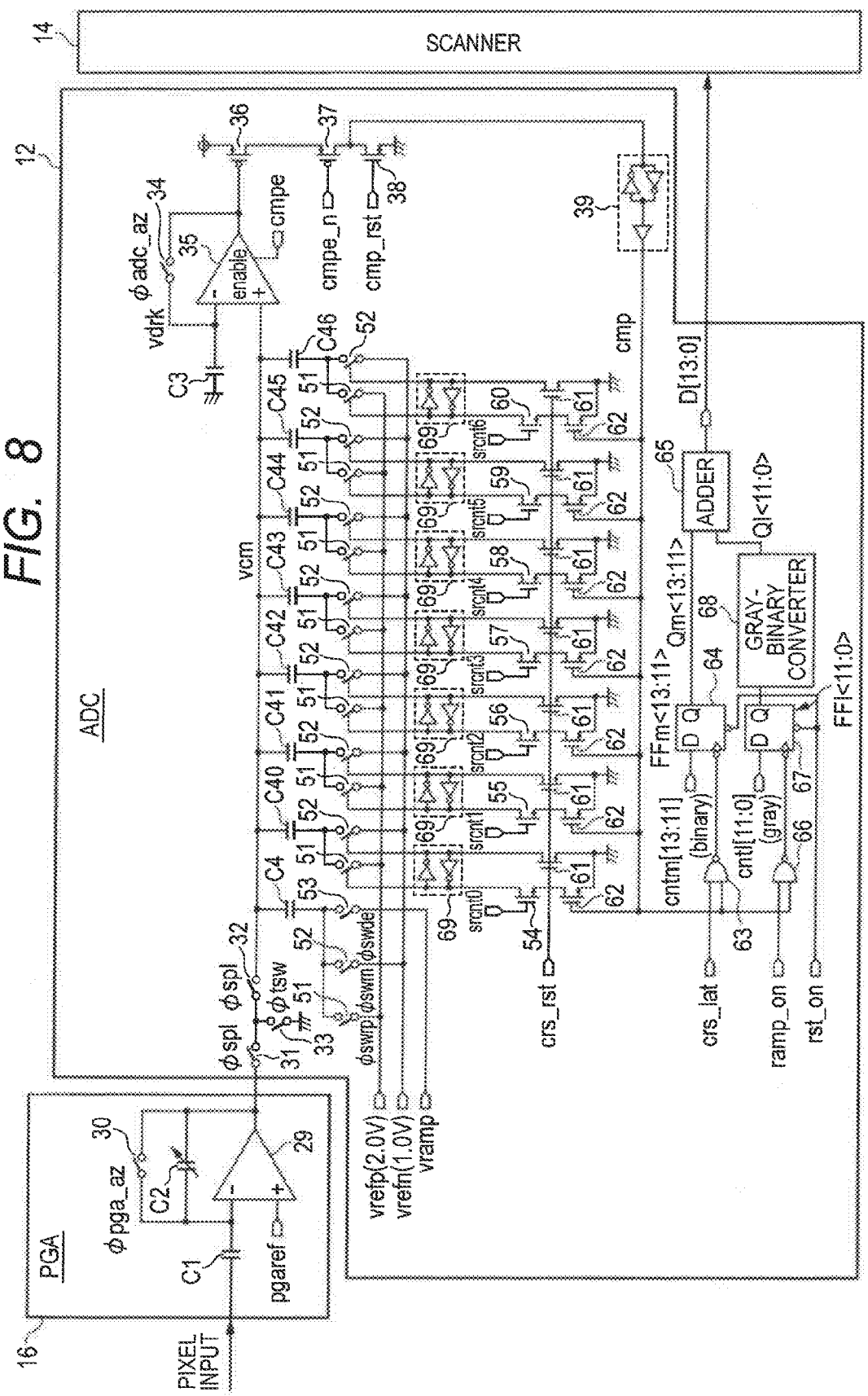
FIG. 8 is a circuit block diagram illustrating the configuration of an ADC and a PGA depicted in FIG. 3.

FIG. 8 is a circuit block diagram illustrating the configuration of the ADC 12 and the PGA 16. The PGA 16 includes a switch 30, a capacitor C1, and a variable capacitor C2. A reference voltage pgaref is supplied to the positive-side input terminal (+ terminal) of the differential amplifier 29, and a pixel input signal is supplied to the negative-side input terminal (− terminal) via the capacitor C1. The output terminal of the differential amplifier 29 is coupled to a variable capacitor C2 for negative feedback and the switch 30 and is also coupled to a switch 31 in the ADC 12. The gain of the PGA 16 can be changed by the variable capacitor C2.

The ADC 12 includes switches 31 to 34 and 51 to 53, a comparator 35, P-channel MOS transistors 36 and 37, N-channel MOS transistors 38 and 54 to 62, hold circuits 39 and 69, NAND circuits 63 and 66, flip flops (FFs) 64 and 67, an adder 65, a gray-binary converter 68, and capacitors C3, C4, and C40 to C46.

To the positive-side input terminal (+ terminal) of the comparator 35, an amplified pixel signal from the PGA 16 is supplied via the switches 31 and 32. To the negative-side input terminal (− terminal) of the comparator 35, an output terminal of the comparator 35 is coupled via the switch 34, and a capacitor C3 holding information of the dark state of a pixel is coupled.

An FF 64 holds an output value of a not-illustrated 3-bit counter. When positive and negative input voltages of the comparator 35 match and a coarse latch signal crs_lat changes to the "H" level, the FF 64 holds an output value cntm<13:11> of the counter and outputs it to the adder 65. The output value of the 3-bit counter corresponds to upper three bits of a digital value after AD conversion and is a binary code. The not-illustrated 3-bit counter is provided in the control circuit/row decoder 13 illustrated in FIG. 2.

The FF 67 holds an output value of a not-illustrated 12-bit counter. When positive and negative input voltages of the comparator 35 match and a ramp_on signal is at the "H" level, the FF 67 holds an output value cntl<11:0> of the counter and outputs it. The output value of the 12-bit counter includes an over-range of one bit, corresponds to lower 11 bits of a digital value after AD conversion and is a gray code. The not-illustrated 12-bit counter is provided in the control circuit/row decoder 13 illustrated in FIG. 2.

The gray-binary converter 68 converts a gray code of 12 bits output from the FF 67 to a binary code Q1<11:0> and outputs it to the adder 65.

The adder 65 adds Qm<13:11> of three bits output from the FF 64 and Ql<11:0> of 12 bits output from the FF 67 and outputs the resultant to the scanner 14.

The capacitors C4 and C40 to C46 have equal electric capacitance and is capacitive-coupled to vcm. By sequentially switching the switches 51 to 53 coupled to those capacitors, the opposite poles in the capacitors C4 and C40 to C46 are sequentially switched and the range to which the potential of vcm belongs in eight ranges is determined. The transistors 54 to 62 control switching of the switches 51 and 52. The details of the operation will be described later.

Signals □spl, □tsw, □adc_az, cmpe, cmpe_n, cmp_rst, □swrp, □swrn, □swda, srcnt0 to srcnt6, vrefp, vrefn, vramp, crs_rst, crs_lat, ramp_on, rst_n, and the like are signals generated by the control circuit/row decoder 13 illustrated in FIG. 2 and are commonly supplied to 3,000 pieces of the column ADC 12 on the upper and lower sides.

Figure 9:
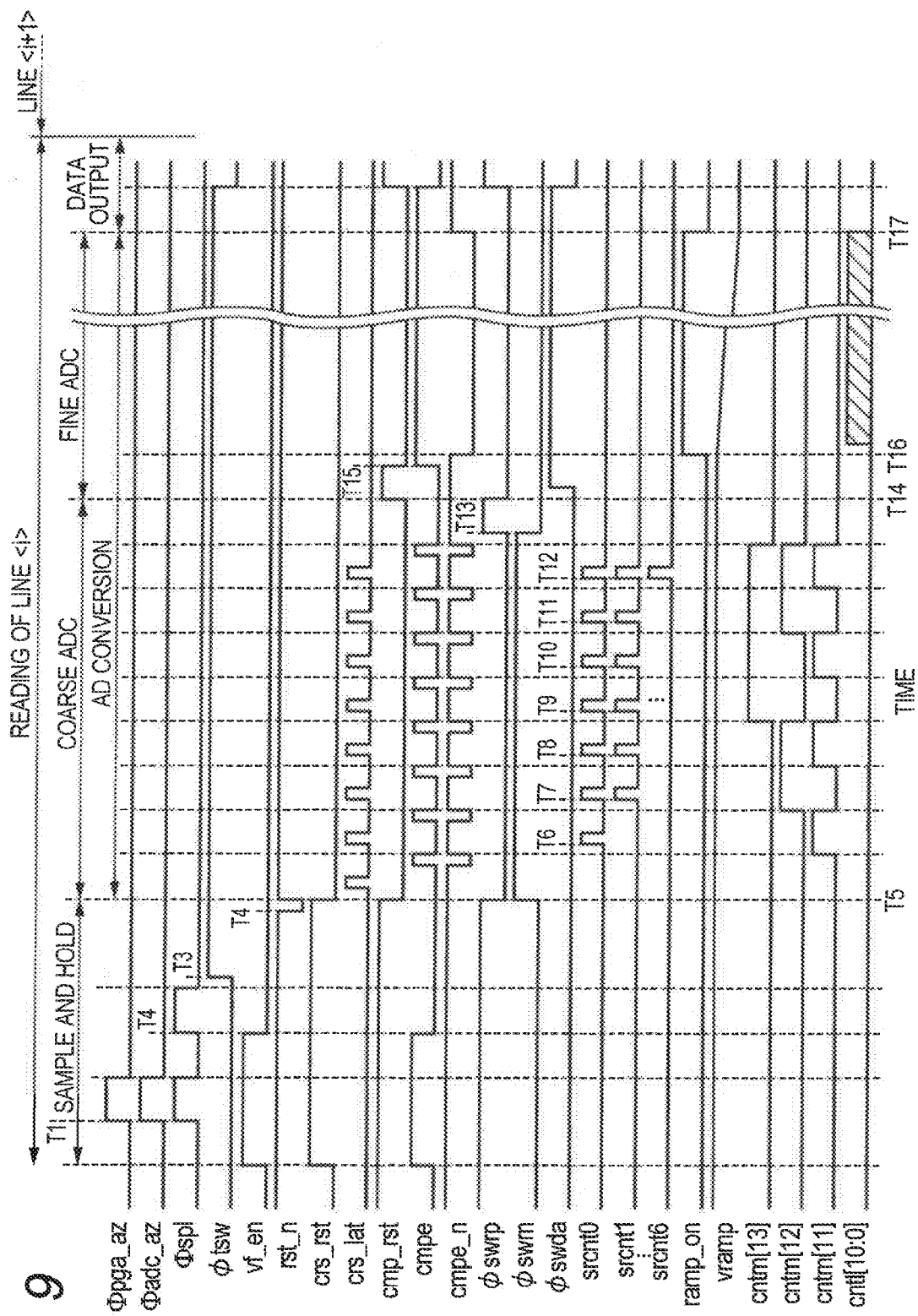
FIG. 9 is a timing chart illustrating a reading operation of pixel signals by the ADC and the PGA depicted in FIG. 8.

FIG. 9 is a timing chart for explaining a reading operation of pixel signals by the ADC 12 and the PGA 16 depicted in FIG. 8. The reading operation is constructed by three stages of sample and hold, AD conversion, and data output and refers to operation of reading pixel information of the i-th row. The AD conversion is divided into two stages of a coarse AD conversion stage and a fine AD conversion stage. In the coarse AD conversion stage, AD conversion of low resolution is performed. In the fine AD conversion stage, AD conversion of high resolution is performed.

First, when a sample & hold stage is started at time T1 and a PGA auto zero signal ☐pga_az, an ADC auto zero signal ☐adc_az, and a sampling signal ☐spl become the "H" level, the switches 31, 32, and 34 enter the on state. At this time, information of the dark state of the pixel is sampled and held in the node vcm. The comparator 35 makes the positive polarity potential (vdrk) of the capacitor C3 hold the information of the dark state of the pixel as a potential.

When the signal spl becomes the "H" level again at time T2, the information of a light state of the pixel output from the PGA 16 is sampled and held as a potential in the node vcm. At this time, signals vf_en and cmpe become the "L" level. The signal vf_en is a signal for selecting whether the comparator 35 operate as an operational amplifier or a comparator. When the signal vf_en is at the "H" level, the comparator 35 is operated as an operational amplifier. When the signal is at the "L" level, the comparator 35 is operated as a comparator. The signal cmpe is a signal which enables an output of the comparator 35 when it is the "H" level.

At time T3, the signal ☐tsw changes from the "L" level to the "H" level and the switch 33 is turned on, thereby initializing the output of the PGA 16. At time T4, when the signal rst_n becomes the "L" level, the FFs 64 and 67 are cleared.

At time T5, when the coarse AD conversion stage is started, the signal ☐swrp changes from the "H" level to the "L" level, and the signal ☐swrn changes from the "L" level to the "H" level, the switch 51 coupled to the capacitor C4 changes from the on state to the off state, and the switch 52 changes from the off stage to the on state. As a result, the opposite pole of the capacitor C4 which is capacitive-coupled to vcm changes from vrefp (2.0V) to vrefn (1.0V). At this time, the potential of vcm drops only by (Vrt−Vrb)/8.

Although the signal crs_rst changes from the "H" level to the "L" level, the right-side terminal of each of the hold circuits 69 holds the "L" level, the left-side terminal holds the "H" level, the transistor 51 coupled to each of the capacitors C40 to C46 maintains the on state, and the transistor 52 maintains the off state.

After time T5, synchronously with a change of outputs cntm[13:11] of the upper-3-bit counter, eight pulses are output in each of the signals crs_lat, cmpe, and cmpe_n.

At time T6, when a signal sfcnt0 changes from the "L" level to the "H" level, the transistor 54 enters the on state. Since the transistor 62 is the on state at this time, the switch 51 coupled to the capacitor C40 is turned off and the switch 52 is turned on. As a result, the opposite pole of the capacitor C40 which is capacitive-coupled to vcm changes from vrefp (2.0V) to vrefn (1.0V), and the potential of vcm further drops only by (Vrt−Vrb)/8.

At time T7, in addition, when the signal srcnt1 changes from the "L" level to the "H" level, the transistor 55 enters the on state. Since the transistor 62 is in the on state at this time, the switch 51 coupled to the capacitor C41 is turned off and the switch 52 is turned on. As a result, the opposite pole of the capacitor C41 which is capacitive-coupled to vcm further drops only by (Vrt−Vrb)/8.

Similar operations are performed from time T8 to T12 to drop the potential of vcm by (Vrt−Vrb)/8 each time. When the potential of vcm becomes lower than the potential of vdrk, the comparator 35 outputs the "L" level. At this time, the transistor 36 is turned on, and the hold circuit 39 changes the signal cmp from the "H" level to the "L" level. The FF 64 holds the values of outputs cntm<13:11> of the 3-bit counter at the rising of a signal output from the NAND circuit 63.

At time T13, the signal ☐swrp changes from the "L" level to the "H" level and the signal ☐swrn changes from the "H" level to the "L" level. Consequently, the switch 51 coupled to the capacitor C4 changes from the off state to the on state, and the switch 52 changes from the on state to the off state. As a result, the opposite pole of the capacitor C4 which is capacitive-coupled vcm changes from vrefn (1.0V) to vrefp (2.0V).

At time T14, when the fine AD conversion stage is started, the signal cmp_rst becomes the "H" level, and the hold circuit 39 sets the signal cmp to the "H" level. At time T15, the signal cmp_rst is set to the "L" level, and the signal cmpe is set to the "H" level. At time T16, the signal cmpe_n is set to the "L" level, and the signal ramp_on is set to the "H" level.

Figure 10:
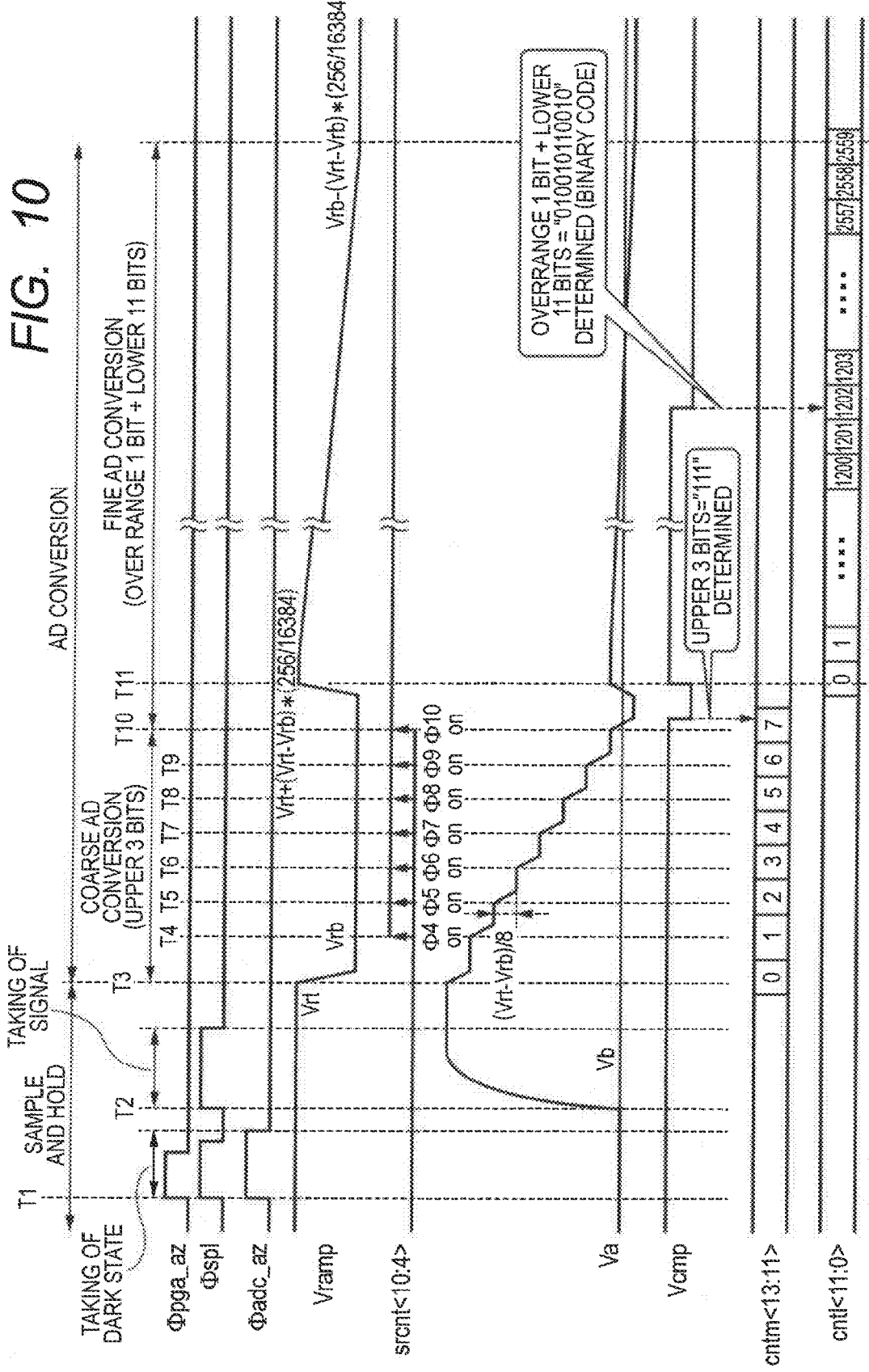
FIG. 10 is a timing chart more specifically illustrating the reading operation depicted in FIG. 9.

FIG. 10 is a timing chart more specifically explaining the operations illustrated in the timing chart of FIG. 9. First, at time T1, when the PGA auto zero signal ☐pga_az, the ADC auto zero signal ☐adc_az, and the sampling signal ☐spl become the "H" level, the comparator 35 makes the positive polarity potential (vdrk) of the capacitor C3 hold the information of the dark state of the pixel as a potential.

When the signal spl becomes the "H" level again at time T2, the information of the light state of the pixel output from the PGA 16 is sampled and held as a potential in the node vcm. In FIG. 10, the potential in the dark state of the pixel is expressed as Va, and the potential in the light state of the pixel is expressed as Vb.

At time T3, the opposite polarity of the capacitor C4 which is capacitive-coupled to vcm changes from vrefp (2.0V) to vrefn (1.0V). At this time, the potential of vcm drops only by (Vrt−Vrb)/8. The output values cntm<13:11> of the 3-bit counter are "0".

At time T4, the opposite polarity of the capacitor C40 which is capacitive-coupled to vcm changes from vrefp (2.0V) to vrefn (1.0V). At this time, the potential of vcm further drops only by (Vrt−Vrb)/8. The output values cntm<13:11> of the 3-bit counter are "1".

Similar operations are performed. When the potential of vcm drops only by (Vrt−Vrb)/8 at time T10, the potential Vb of vcm becomes lower than the potential Va of vdrk, and the hold circuit 39 outputs the "L" level as a signal cmp (Vcmp). At this time, the values of outputs cntm<13:11> of the 3-bit counter are determined as upper three bits of the digital value after AD conversion. That is, it expresses that the digital value of the pixel information satisfies 14336 (=2048×7) pixel information 16383 (=2048×8−1).

After time T10, the fine AD conversion stage is executed and the above-described range of pixel information is determined. At time T11, ☐swda is set to the "H" level to turn on the switch 53 and raise vramp as the potential of the opposite polarity of the capacitor C4 to Vrt+(Vrt−Vrb)×(256/2048). At this time, the 12-bit counter provided in the control circuit/row decoder 13 starts counting up from "0" by decimal conversion.

After that, the potential of Vramp is increased like a slope to Vrb+(Vrt−Vrb)×(256/2048). At the drop end point of the potential of the opposite polarity of the capacitor C4, the value of the 12-bit counter becomes "2559" in decimal conversion.

As a result, the potential of vcm is increased from the end point of the coarse AD conversion stage only by (Vrt−Vrb)×{1+(256/2048)}×(1/8). The potential of vcm drops like a slop and reaches a state that it is decreased from the end point of the coarse AD conversion stage only by (Vrt−Vrb)×{1+(256/2048)}×(1/8).

When the potential of the node vcm becomes lower than the potential of vdrk, the comparator 35 outputs the "L" level. At this time, the transistor 36 is turned on, and the hold circuit 39 changes the signal cmp from the "H" level to the "L" level.

The FF 67 holds the values of the outputs cntl[11:0] of the 12-bit counter at the rising of a signal output from the NAND circuit 66. In FIG. 10, "1202" is held in decimal conversion by the FF 67. The gray-binary converter 68 receives a gray code output from the FF 67, converts it to a binary code Q1<11:0> and outputs the binary code to the adder 65.

At the coarse AD conversion stage, the upper three bits of the digital value are determined, and lower 12 bits of the digital value including the over range of one bit in the fine AD conversion stage are determined. In FIG. 10, "14336" and "1202" are obtained in decimal conversion. Consequently, the adder 65 computes D<13:0>=Qm<13:11>+Q1<11:0>−256 and outputs "15282" in decimal conversion.

Referring again to FIG. 1, there are two types of the image processing engine 7; the single-end transmission type, and the SubLVDS type. The CMOS image sensor 3 is constructed so as to be able to be conformed to any of the single-end transmission type and the SubLVDS type. In the case where the image processing engine 7 of the single-end transmission type is used, the CMOS image sensor 3 is set in the parallel transmission mode. In the case where the image processing engine 7 of the SubLVDS type is used, the CMOS image sensor 3 is set in the serial transmission mode.

Description of Output Driver Unit

Figure 11:
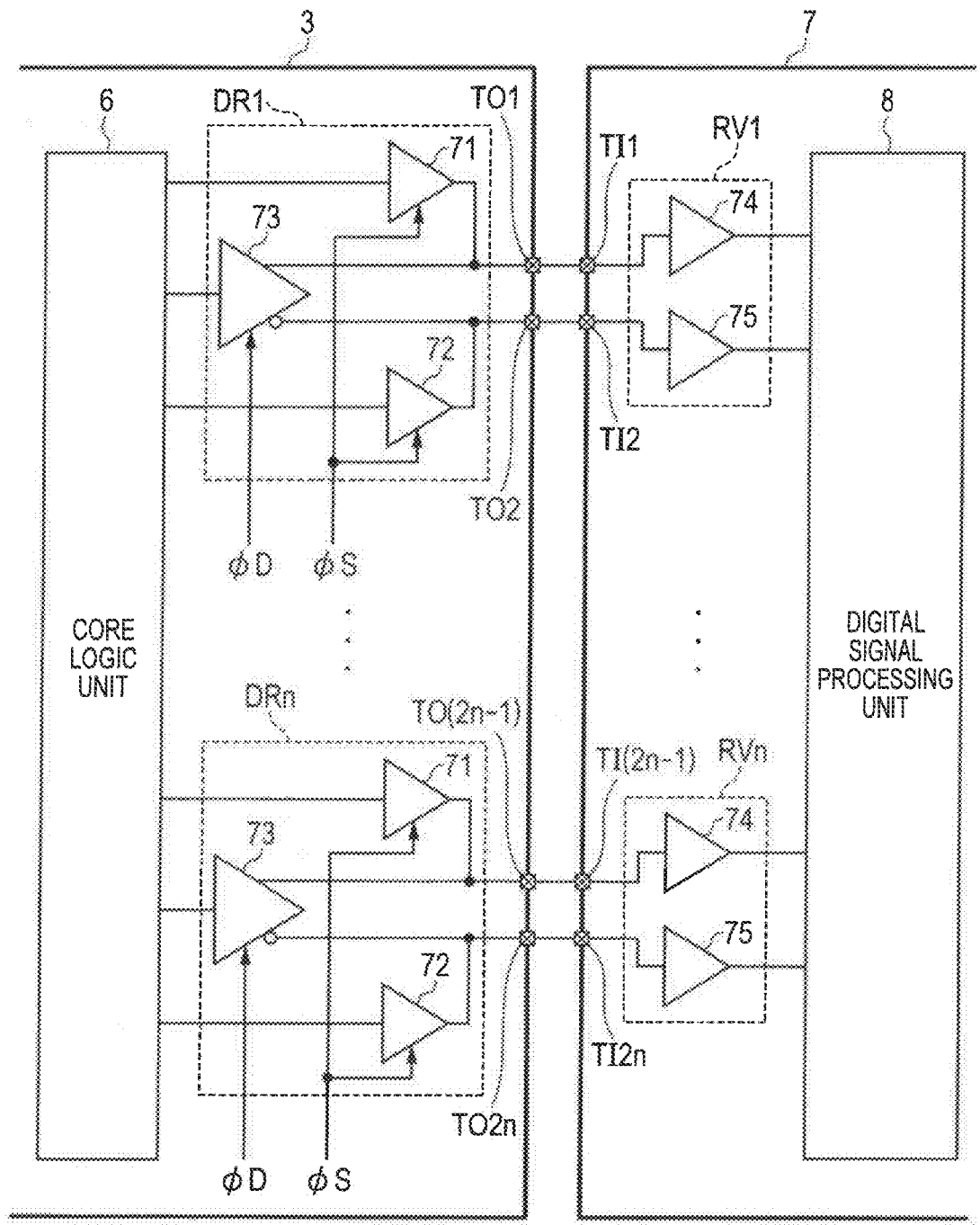
FIG. 11 is a circuit block diagram illustrating a main part of the CMOS image sensor and an image processing engine of a single-end transmission type depicted in FIG. 1.

FIG. 11 is a circuit block diagram illustrating the configuration of the drivers DR1 to DRn of the CMOS image sensor 3 and receivers RV1 to RVn of the single-end transmission type. In FIG. 11, each of the drivers DR has single-end drivers 71 and 72 and a differential driver 73.

The control signal □S is supplied to each of the single-end drivers 71 and 72, and the control signal □D is supplied to the differential driver 73. In the parallel transmission mode, the control signal □S is set to the "H" level as an activation level and each of the single-end drivers 71 and 72 is activated. The control signal □D is set to the "L" level as an inactivation level and the differential driver 73 is inactivated. Each of the activated single-end drivers 71 and 72 outputs a data signal supplied from the core logic unit 6 as a single-end signal of the CMOS interface standard to the corresponding output terminal TO.

In the serial transmission mode, the control signal □S is set to the "L" level as an inactivation level and each of the single-end drivers 71 and 72 is inactivated. The control signal □D is set to the "H" level as an activation level and the differential driver 73 is activated. The activated differential driver 73 outputs a data signal supplied from the core logic unit 6 as a differential signal of the SubLVDS standard to two corresponding output terminals TO.

Each of the receivers RV1 to RVn of the single-end type has two buffers 74 and 75. The buffer 74 transmits the data signal supplied from the corresponding single-end driver 71 to the digital signal processing unit 8. The buffer 75 transmits the data signal supplied from the corresponding single-end drier 72 to the digital signal processing unit 8.

In FIG. 11, since the image processing engine 7 is of the single-end transmission type, the CMOS image sensor 3 is set in the parallel transmission mode, the single-end drivers 71 and 72 are activated, and the differential driver 73 is inactivated. The core logic unit 6 outputs data signals D1 to D2n in parallel to n sets of single-end drivers 71 and 72.

The single-end drivers 71 and 72 of the drivers DR1 to DRn transmit the data signals D1 to D2n to output terminals TO1 to TO2n. A data signal D supplied to an output terminal TO is a single-end signal. The data signals D1 to D2n transmitted to the output terminals TO1 to TO2n are further transmitted to the buffers 74 and 75 of the receivers RV1 to RVn via the input terminals TI1 to TI2n. The buffers 74 and 75 of the receivers RV1 to RVn transmit the data signals D1 to D2n to the digital signal processing unit 8.

Figure 12:
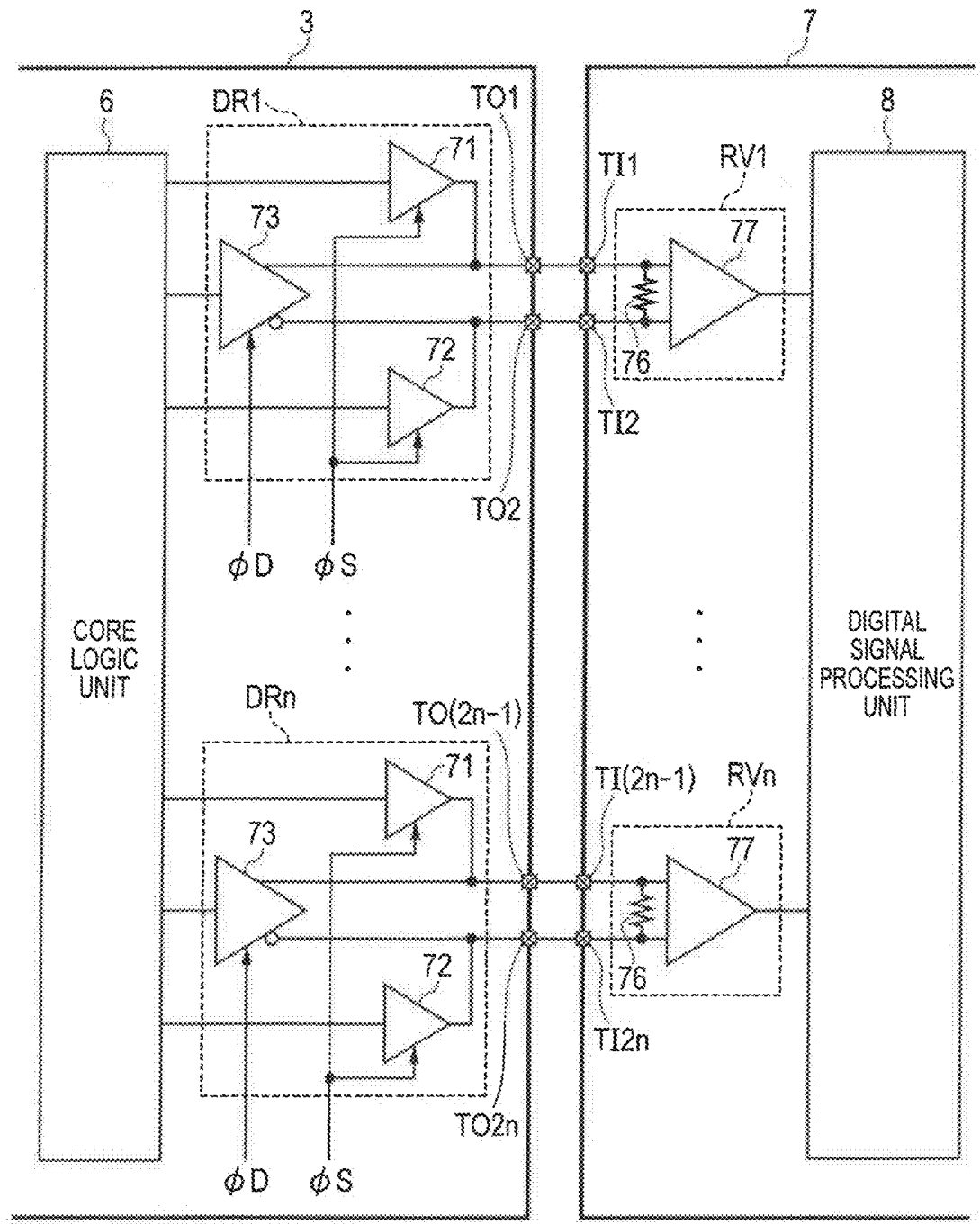
FIG. 12 is a circuit block diagram illustrating a main part of the CMOS image sensor and an image processing engine of a SubLVDS type depicted in FIG. 1.

FIG. 12 is a circuit block diagram illustrating the configuration of the drivers DR1 to DRn of the CMOS image sensor 3 and the receivers RV1 to RVn of the SubLVDS type and is a diagram to be compared with FIG. 11. In FIG. 12, each of the receivers RV1 to RVn of the SubLVDS type includes a termination resistive element 76 and a comparator 77. The termination resistive element 76 is coupled between corresponding two input terminals TI. The resistance value of the termination resistive element 76 is, for example, 100Ω. The two input terminals of the comparator 77 are coupled to the corresponding two input terminals TI. The comparator 77 compares the voltages of the two input terminals and supplies a data signal indicative of a comparison result to the digital signal processing unit 8.

In FIG. 12, sine the image processing engine 7 is of the SubLVDS type, the CMOS image sensor 3 is set in the serial transmission mode, the single-end drivers 71 and 72 are inactivated, and the differential driver 73 is activated. The core logic unit 6 supplies the data signals D1 to D2n in series to the differential drivers 73.

The differential drivers 73 output the data signals D1 to D2n supplied in series from the core logic unit 6 as differential signals across the corresponding two output terminals TO. That is, 2n pieces of the data signals D1 to D2n in parallel are converted by the core logic unit 6 to 2n pieces of data signals D1 to D2n in series, and the 2n pieces of data signals D1 to D2n in series are supplied to the corresponding differential driver 73. The 2n pieces of data signals D1 to D2n in series are converted to the 2n pieces of differential signals in series by the differential drier 73, and the 2n pieces of differential signals are sequentially output to the two corresponding output terminals TO. The two output terminals TO for outputting the differential signals are also called a data lane.

The 2n pieces of differential signals supplied in series to the two output terminals TO are further transmitted to the comparator 77 of the receiver RV via the two input terminals TI. The comparator 77 of the receiver RV converts each of the 2n pieces of differential signals supplied in series to a data signal and gives the data signal to the digital signal processing unit 8.

In the parallel transmission mode, by setting each of the output terminals TO to 0V or 1.8V, a data signal is transmitted. On the other hand, in the serial transmission mode, any one of the two output terminals TO is set to 1.0V and the other output terminal TO is set to 0.8V. Therefore, in the serial transmission mode, the voltage of the output terminal TO is just changed to 0.2V(=1.0V−0.8V), the data signal can be transmitted at speed higher than that in the parallel transmission type of changing the voltage of the output terminal TO to 1.8V (=1.8V–0V).

Figure 13:
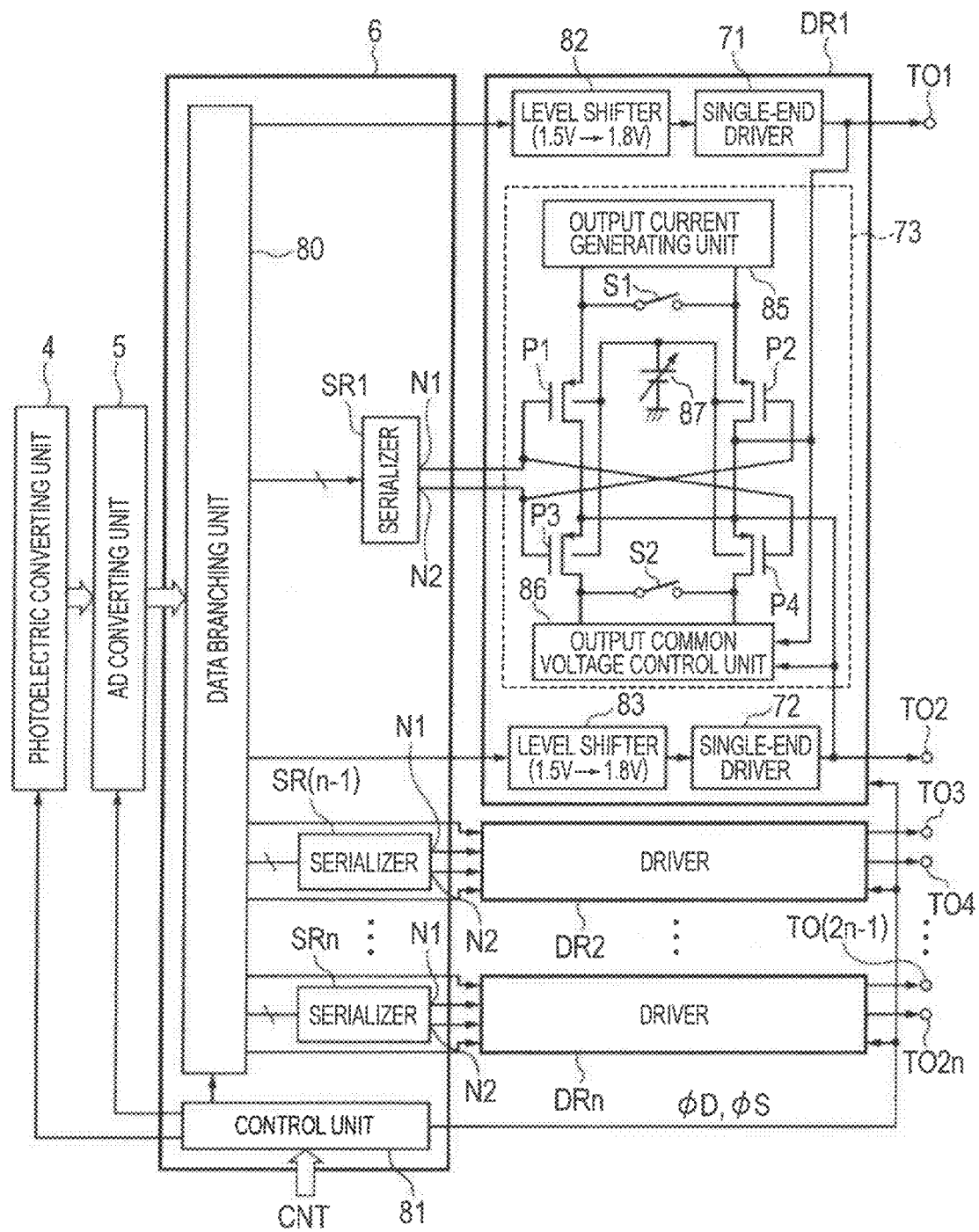
FIG. 13 is a circuit block diagram illustrating the configuration of a core logic unit and a driver depicted in FIG. 12.

FIG. 13 is a circuit block diagram illustrating the configuration of the core logic unit 6 and the driver DR. In FIG. 13, the core logic unit 6 includes a data branching unit 80, a control unit 81, and m pieces of serializers SR1 to SRm. In the parallel transmission mode, the data branching unit 80 supplies m×2n pieces of data signals supplied in parallel from the AD converter 5 by 2n pieces in m times to the 2n pieces of output terminals TO1 to TO2n. In the serial transmission mode, the data branching unit 80 supplies m×2n pieces of data signals given in parallel from the AD converter 5 to the m pieces of serializers SR1 to SRm by 2n pieces.

The serializers SR1 to SRm are provided in correspondence with the differential drivers 73 in the drivers DR1 to DRm, respectively. Each serializer SR outputs the 2n pieces of data signals D supplied in parallel from the data branching unit 80 in the serial transmission mode one by one in series to the corresponding differential driver 73. FIG. 13 illustrates the case where m=n.

Each serializer SR includes two output nodes N1 and N2 and is driven by a grounding voltage (reference voltage) of 0V and a power supply voltage (first voltage) of 1.5V. Each serializer SR fixes both of the output nodes N1 and N2 to 1.5V in the parallel transmission mode, and sets any one of the output nodes N1 and N2 to 1.5V in accordance with the logic of the output data signal and sets the other node to 0V in the serial transmission mode.

The control unit 81 controls the photoelectric converting unit 4, the AD converting unit 5, the data branching unit 80, and the drivers DR1 to DRn in accordance with the control signal CNT from the control device 9. Since the data transmission speed in the serial transmission mode is higher than that in the parallel transmission mode, the frame rate in the serial transmission mode is faster than that in the parallel transmission mode.

Each of the photoelectric converting unit 4 and the AD converting unit 5 is mainly constructed by a thick-film MOS transistor and is driven by the grounding voltage (reference voltage) of 0V and the power supply voltage of 3.3V. Since the core logic unit 6 has to operate at high speed, it is mainly constructed by a thin-film MOS transistor and is driven by the grounding voltage of 0V and the power supply voltage of 1.5V. Each of the drivers DR1 to DRn is mainly constructed by a thick-film MOS transistor and is driven by the grounding voltage of 0V and the power supply voltage (second voltage) of 1.8V.

Gate Film Thickness and Withstand Voltage of MOS Transistor

FIGS. 14A and 14B illustrate a symbol and a configuration, respectively, of a thin-film P-channel MOS transistor, and FIGS. 14C and 14D illustrate a symbol and a configuration, respectively, of a thick-film P-channel MOS transistor. FIGS. 14E and 14F illustrate a symbol and a configuration, respectively, of a thin-film N-channel MOS transistor, and FIGS. 14G and 14H illustrate a symbol and a configuration, respectively, of a thick-film N-channel MOS transistor.

As illustrated in FIGS. 14A to 14D, the P-channel MOS transistor is obtained by forming an N-type well 91 in the surface of a silicon substrate 90, stacking a gate insulating film 92 and a gate electrode 93 on the surface of the N-type well 91, and forming P+ type impurity diffusion regions 94 and 95 on both sides of the gate insulting film 92 in the surface of the N-type well 91. The gate electrode 93, the P+ type impurity diffusion regions 94 and 95, and the N-type well 91 are set as a gate, a source, a drain, and a back gate, respectively, of the P-channel MOS transistor.

The thickness and width of the gate insulating film 92 of the thin-film P-channel MOS transistor are smaller than the thickness and width of the gate insulating film 92 of the thick-film P-channel MOS transistor. Consequently, the thin-film P-channel MOS transistor operates at high speed by a voltage lower than that for the thick-film P-channel MOS transistor. However, the withstand voltage of the thin-film P-channel MOS transistor is smaller than that of the thick-film P-channel MOS transistor.

In the symbol of the P-channel MOS transistor, the part with the arrow is the source. In the thin-film P-channel MOS transistor, the part of the gate is indicated by a thin line. In the thick-film P-channel MOS transistor, the part of the gate is indicated by a thick line.

As illustrated in FIGS. 14E to 14H, the N-channel MOS transistor is obtained by forming a P-type well 91 in the surface of a silicon substrate 100, stacking a gate insulating film 102 and a gate electrode 103 on the surface of the P-type well 101, and forming N+ type impurity diffusion regions 104 and 105 on both sides of the gate insulting film 102 in the surface of the P-type well 101. The gate electrode 103, the P+ type impurity diffusion regions 104 and 105, and the P-type well 101 are set as a gate, a source, a drain, and a back gate, respectively, of the N-channel MOS transistor.

The thickness and width of the gate insulating film 102 of the thin-film P-channel MOS transistor are smaller than the thickness and width of the gate insulating film 102 of the thick-film P-channel MOS transistor. Consequently, the thin-film N-channel MOS transistor operates at high speed by a voltage lower than that for the thick-film N-channel MOS transistor. However, the withstand voltage of the thin-film N-channel MOS transistor is smaller than that of the thick-film P-channel MOS transistor.

In the symbol of the N-channel MOS transistor, the part with the arrow is the source. In the thin-film N-channel MOS transistor, the part of the gate is indicated by a thin line. In the thick-film N-channel MOS transistor, the part of the gate is indicated by a thick line.

Referring again to FIG. 13, the driver DR1 includes, in addition to the above-described drivers 71 to 73, level shifters 82 and 83. Since the core logic unit 6 is driven by the grounding voltage of 0V and the power supply voltage of 1.5V, the output data signal becomes 0V or 1.5V.

The level shifter 82 level-shifts the amplitude of the output data signal of the data branching unit 80 from 1.5V to 1.8V and supplies the resultant to the single-end driver 71. The single-end driver 71 is driven by the grounding voltage of 0V and the power supply voltage of 1.8V and outputs the output data signal of the level shifter 83 as a single-end signal to the output terminal TO1.

The level shifter 83 level-shifts the amplitude of the output data signal of the data branching unit 80 from 1.5V to 1.8V and supplies the resultant to the single-end driver 72. The single-end driver 72 is driven by the grounding voltage of 0V and the power supply voltage of 1.8V and outputs the output data signal of the level shifter 83 as a single-end signal to the output terminal TO2.

For example, when the data signal to be output is at the "H" level (1), the output terminal TO is set to the "H" level (1.8V). When the data signal to be output is at the "L" level (0), the output terminal TO is set to the "L" level (0V).

The differential driver 73 includes P-channel MOS transistors P1 to P4, switches S1 and S2, an output current generating unit 85, an output common voltage control unit

86, and a back gate control unit 87. Each of the P-channel MOS transistors P1 to P4 has to operate at high speed and is therefore constructed by a thin-film MOS transistor.

The sources of the P-channel MOS transistors P1 and P2 are coupled to one terminal and the other terminal of the switch S1, the gates of them are coupled to the output nodes N1 and N2 of the corresponding serializer SR1, and the drains of them are coupled to the corresponding output terminals TO2 and TO1.

The sources of the P-channel MOS transistors P3 and P4 are coupled to the corresponding output terminals, the gates of them are coupled to the output nodes N2 and N1 of the corresponding serializer SR1, and the drains of them are coupled to one terminal and the other terminal of the switch S2.

The output current generating unit 85 is activated in the serial transmission mode and supplies output current to each of the sources of the P-channel MOS transistors P1 and P2. The output common voltage control unit 86 is activated in the serial transmission mode and controls the voltage of the drains of the P-channel MOS transistors P3 and p4 so that the common voltage of the output terminals TO1 and TO2 becomes a predetermined voltage.

The switches S1 and S2 are turned off in the case where at least the voltage of the output terminal TO1 and that of the output terminal TO2 are different in the parallel transmission mode and are turned on in the serial transmission mode. The case where the voltage of the output terminal TO1 and that of the output terminal TO2 are different is the case where the output terminal of any of the output terminals TO1 and TO2 becomes 1.8V and the other output terminal becomes 0V.

The back gate control unit 87 supplies the power supply voltage (second voltage) of 1.8V to the back gates of the P-channel MOS transistors P1 to P4 in the parallel transmission mode and supplies 1.0V (third voltage) to the back gates of the P-channel MOS transistors P1 to P4 in the serial transmission mode.

Next, the operation of the differential driver 73 will be described. In the parallel transmission mode, the differential driver 73 is inactivated. Specifically, the output current generating unit 85 is inactivated to stop supply of the output current to the transistors P1 and P2. The output common voltage control unit 86 is inactivated to stop control of the drain voltages of the transistors P3 and P4.

The switch S1 is turned off so that the sources of the P-channel MOS transistors P1 and P2 are electrically separated, and the switch S2 is turned off so that the drains of the P-channel MOS transistors P3 and P4 are electrically separated. By the back gate control unit 87, the back-gate voltage of the P-channel MOS transistors P1 to P4 is set to 1.8V. The switches S1 and S2 and the back gate control unit 87 are provided to prevent a flow-through current from flowing in the differential driver 73. The switches S1 and S2 and the back-gate control unit 87 will be described in detail later. Both of the output nodes N1 and N2 of the serializer SR1 are fixed to 1.5V.

By the above, the influence of the differential driver 73 exerted in the output terminals TO1 and TO2 in the parallel transmission mode is suppressed to the minimum, and the output terminal TO is driven to 1.8V or 0V by the single-end driver 71.

In the serial transmission mode, the single-end drivers 71 and 72 are inactivated so that the output nodes of the single-end drivers 71 and 72 are set to the floating state, and the differential driver 73 is activated.

That is, the output current generating unit 85 is activated and output current is supplied to each of the sources of the P-channel MOS transistors P1 and P2 from the output current generating unit 85. The output common voltage control unit 86 is activated and the voltages of the drains of the P-channel MOS transistors P3 and P4 are controlled so that the common voltage of the output terminals TO1 and TO2 becomes a predetermined voltage. The switch S1 is turned on so that the sources of the P-channel MOS transistors P1 and P2 are electrically coupled, and the switch S2 is turned on so that the drains of the P-channel MOS transistors P3 and P4 are electrically coupled. By the back-gate control unit 87, the back-gate voltages of the P-channel MOS transistors P1 to P4 are set to 1.0V.

When the output nodes N1 and N2 of the serializer SR1 are set to 1.5V (first voltage) and 0V (reference voltage) in this state, the resistance value of the P-channel MOS transistors P2 and P3 becomes smaller than that of the P-channel MOS transistors P1 and P4, and the output terminals TO1 and TO2 are set to 1.0V (third voltage) and 0.8V (fourth voltage), respectively.

When the output nodes N1 and N2 of the serializer SR1 are set to 0V and 1.5V, respectively, the resistance value of the P-channel MOS transistors P1 and P4 becomes smaller than that of the P-channel MOS transistors P2 and P3, and the output terminals TO1 and TO2 are set to 0.8V and 1.0V, respectively.

Next, necessity of the switches S1 and S2 will be described. As illustrated in FIGS. 14A and 14B, in each of the P-channel MOS transistors P1 to P4, a parasitic diode exists between the source (P+ type impurity diffusion region 94) and the back gate (N-type well 91), and a parasitic diode exists between the drain (P+ type impurity diffusion region 95) and the back gate (N-type well 91).

Description at the Time of Operation of Output Driver

Figure 15:
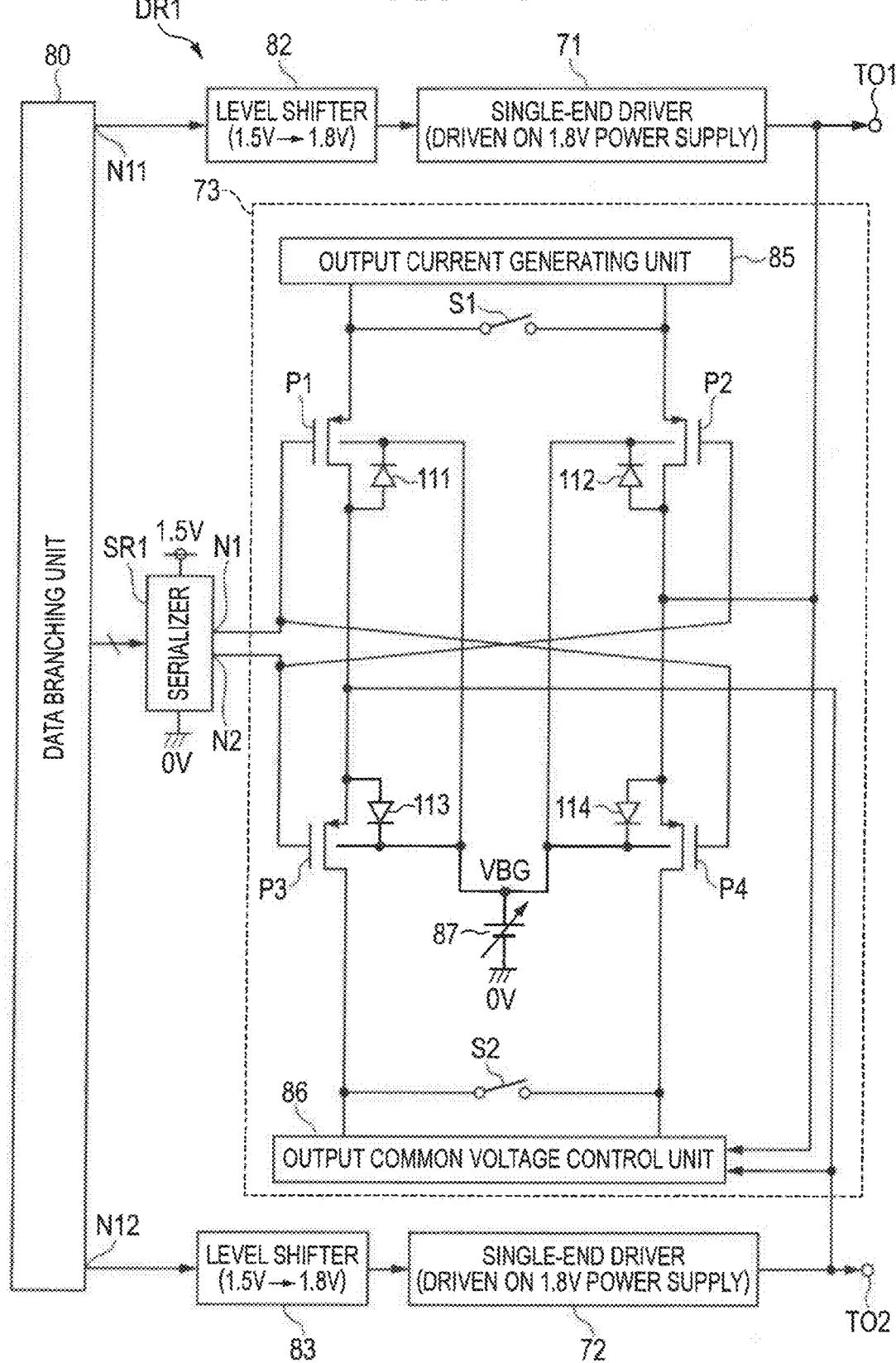
FIG. 15 is a circuit block diagram illustrating a main part of a core logic unit and a driver depicted in FIG. 13.

FIG. 15 is a circuit block diagram illustrating the switches S1 and S2 of the parasitic diodes included in the P-channel MOS transistors P1 to P4 of the driver DR1 and related parasitic diodes 111 to 114. In FIG. 15, the anodes of the parasitic diodes 111 and 112 are coupled to the drains of the P-channel MOS transistors P1 and P2, respectively, and the cathodes of the parasitic diodes 111 and 112 are coupled to the back gates of the P-channel MOS transistors P1 and P2, respectively. The nodes of the parasitic diodes 113 and 114 are coupled to the sources of the P-channel MOS transistors P3 and P4, respectively, and the cathodes of the parasitic diodes 113 and 114 are coupled to the back gates of the P-channel MOS transistors P3 and P4, respectively.

FIG. 16 is a diagram illustrating the states of the circuits depicted in FIG. 15. In FIG. 16, in the boxes of Nos. 1 and 2, the voltages of nodes N11 and N12 of the data branching unit 80 are illustrated. The output nodes N11 and N12 are coupled to the level shifters 82 and 83 of the driver DR1, respectively. In the parallel transmission mode, each of the output nodes N11 and N12 is individually set to 0V or 1.5V. The voltages of the output nodes N11 and N12 are set to 0V (state A), set to 0V and 1.5V, respectively (state B), set to 1.5V and 0V, respectively (state C), and set to 1.5V (state D). In the serial transmission mode, both of the output nodes N11 and N12 are fixed to 0V.

In the boxes of Nos. 3 and 4, the voltages of output nodes N1 and N2 of the serializer SR1 are illustrated. In the parallel transmission mode, both of the voltages of the output nodes N1 and N2 are fixed to 1.5V. In the serial transmission mode, any one of the output nodes N1 and N2 is fixed to 0V, and the other node is set to 1.5V. The voltages of the output nodes N1 and N2 are set to 0V and 1.5V, respectively (state E) and set to 1.5V and 0V, respectively (state F).

In the boxes of Nos. 5 and 6, the voltages of the output terminals TO1 and TO2 are illustrated. The voltages of the output terminals TO1 and TO2 become 0V in the state A, become 0V and 1.8V, respectively, in the state B, become 1.8V and 0V, respectively, in the state C, become 1.8V in the state D, become 0.8V and 1.0V, respectively, in the state E, and become 1.0V and 0.8V, respectively, in the state F.

In Nos. 7 to 10, the on/off states of the P-channel MOS transistors P1 to P4 are illustrated, respectively. In the parallel transmission mode, both of the output nodes N1 and N2 of the serializer SR1 are fixed to 1.5V, and both of the gates of the P-channel MOS transistors P1 and P4 are fixed to 1.5V. In the state A where both of the output terminals TO1 and TO2 become 0V, all of the P-channel MOS transistors P1 to P4 are off.

In the state B where both of the output terminals TO1 and TO2 become 0V and 1.8V, respectively, both of the P-channel MOS transistors P1 and P3 are turned on and both of the P-channel MOS transistors P2 and P4 are turned off. If the switches S1 and S2 are on at this time, the voltage of 1.8V applied to the output terminal TO2 is applied to the source of the transistor P2 via the transistor P1 and the switch S1, the gate voltage (1.5V) of the transistor P2 becomes lower than the source voltage (1.8V), and the transistor P2 is also turned on. Consequently, a flow-through current flows from the output terminal TO2 of 1.8V to the output terminal TO1 of 0V via the transistor P1, the switch S1, and the transistor P2, and the CMOS image sensor 3 fails.

The voltage of 1.8V applied to the output terminal TO2 is applied to the drain of the transistor P4 via the transistor P3 and the switch S2, the gate voltage (1.5V) of the transistor P4 becomes lower than the drain voltage (1.8V), and the transistor P4 is also turned on. Consequently, a flow-through current flows from the output terminal TO2 of 1.8V to the output terminal TO1 of 0V via the transistor P3, the switch S2, and the transistor P4, and the CMOS image sensor 3 fails. Therefore, in the first embodiment, by turning off the switches S1 and S2 in the state B, the flow-through current is prevented from flowing from the output terminal TO2 to the output terminal TO1 via the differential driver 73.

Figure 17:
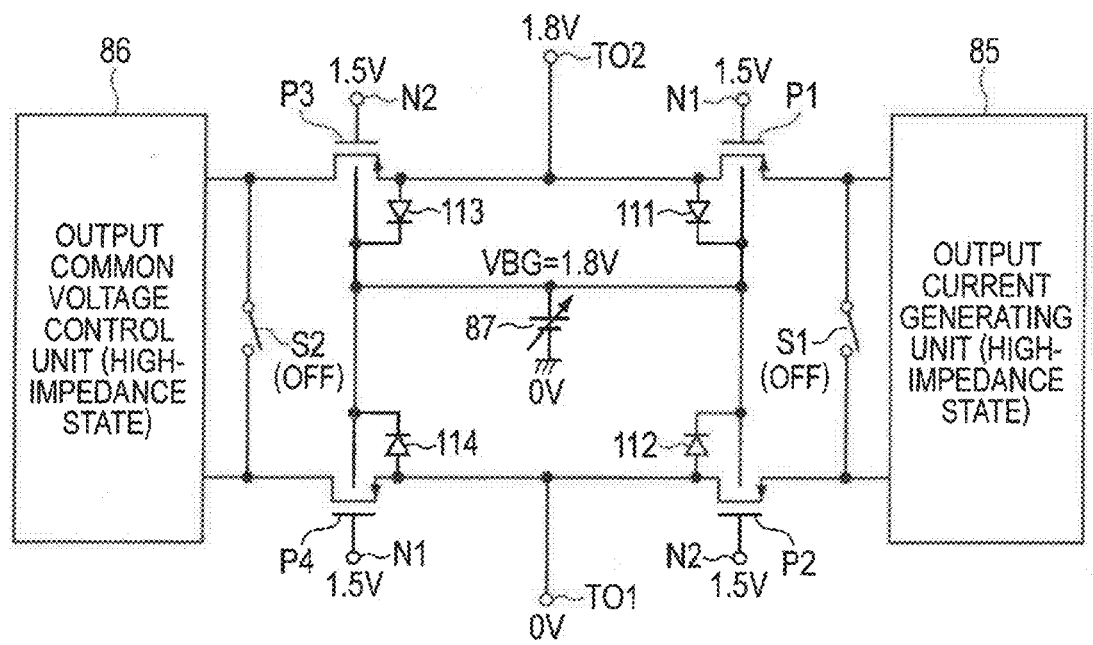
FIG. 17 is a circuit block diagram for explaining necessity of switches depicted in FIG. 15.

FIG. 17 illustrates the case where the switches S1 and S2 are off in the state B. In the state B, the output terminal TO2 is set to 1.8V, the transistors P1 and P3 are turned on. However, since the switches S1 and S2 are off, a flow-through current does not flow from the output terminal TO2 to the output terminal TO1.

Referring again to FIG. 16, in the state C where the output terminals TO1 and TO2 are 1.8V and 0V, respectively, both of the P-channel MOS transistors P2 and P4 are on and the P-channel MOS transistors P1 and P3 are off. If the switches S1 and S2 are on in this state, the voltage of 1.8V applied to the output terminal TO1 is applied to the source of the transistor P1 via the transistor P2 and the switch S1, the gate voltage (1.5V) of the transistor P1 becomes lower than the source voltage (1.8V), and the transistor P1 is also turned on. Consequently, a flow-through current flows from the output terminal TO1 of 1.8V to the output terminal TO2 of 0V via the transistor P2, the switch S1, and the transistor P1, and the CMOS image sensor 3 fails.

The voltage of 1.8V applied to the output terminal TO1 is applied to the drain of the transistor P3 via the transistor P4 and the switch S2, the gate voltage (1.5V) of the transistor P3 becomes lower than the drain voltage (1.8V), and the transistor P3 is also turned on. Consequently, a flow-through current flows from the output terminal TO1 of 1.8V to the output terminal TO2 of 0V via the transistor P4, the switch S2, and the transistor P3, and the CMOS image sensor 3 fails. Therefore, in the first embodiment, by turning off the switches S1 and S2 in the state C, the flow-through current is prevented from flowing from the output terminal TO1 to the output terminal TO2 via the differential driver 73.

In the state C where both of the output terminals TO1 and TO2 are 1.8V, all of the P-channel MOS transistors P1 to P4 are on. However, since the voltage of the output terminal TO1 and the voltage of the output terminal TO2 are the same, no flow-through current flows across the output terminals TO1 and TO2.

From the above, in the states B and C, to prevent a flow-through current from flowing across the output terminals TO1 and TO2, the switches S1 and S2 have to be always turned off. In the states A and D, a flow-through current does not flow across the output terminals TO1 and TO2, so that the switches S1 and S2 may be turned on or off. In the parallel transmission mode, the switches S1 and S2 may be always off. Alternatively, the switches S1 and S2 may be off in the states B and C and may be on in the states A and D.

In the serial transmission mode, regardless of the states E and F, the switches S1 and S2 are turned on to activate the differential driver 73. In the state E, the transistors P3 and P4 are on and the transistors P1 and P2 are off. In the state F, the transistors P1 and P2 are on and the transistors P3 and P4 are off.

Referring again to FIG. 16, in No. 11, a back-gate voltage VBG of the P-channel MOS transistors P1 to P4, that is, the output voltage VBG of the back-gate control unit 87 is illustrated. In the states A to D in the parallel transmission mode, the back-gate voltage VBG is set to 1.8V. The operation is performed, in the case where the output terminal TO1 or TO2 in the states B, C, and D is set to 1.8V, to prevent the parasitic diodes 111 to 114 of the transistors P1 to P4 from turning on.

FIG. 17 illustrates the case where the back-gate voltage VBG is set to 1.8V in the state B. In the state B, 1.8V is applied to the output terminal TO2. In the case where the difference between the voltage (1.8V) of the output terminal TO2 and the back-gate voltage VBG is larger than the threshold voltage of the parasitic diodes 111 and 113, the parasitic diodes 111 and 113 are turned on, and a flow-through current flows from the output terminal TO2 to the back-gate control unit 87 via the parasitic diodes 111 and 113. In the first embodiment, in the state B, the back-gate voltage VBG is set to 1.8V, so that the parasitic diodes 111 and 113 are maintained in the off state, and a flow-through current does not flow from the output terminal TO2 to the back-gate control unit 87 via the parasitic diodes 111 and 113.

Referring again to No. 11 in FIG. 16, in the serial transmission mode, the back-gate voltage VBG of the P-channel MOS transistors P1 to P4 is set to 1.0V. It is performed, in the case where the output terminal TO1 or TO2 in the states E and F is set to 1.0V, to prevent the parasitic diodes 111 to 114 of the transistors P1 to P4 from turning on.

Figure 18:
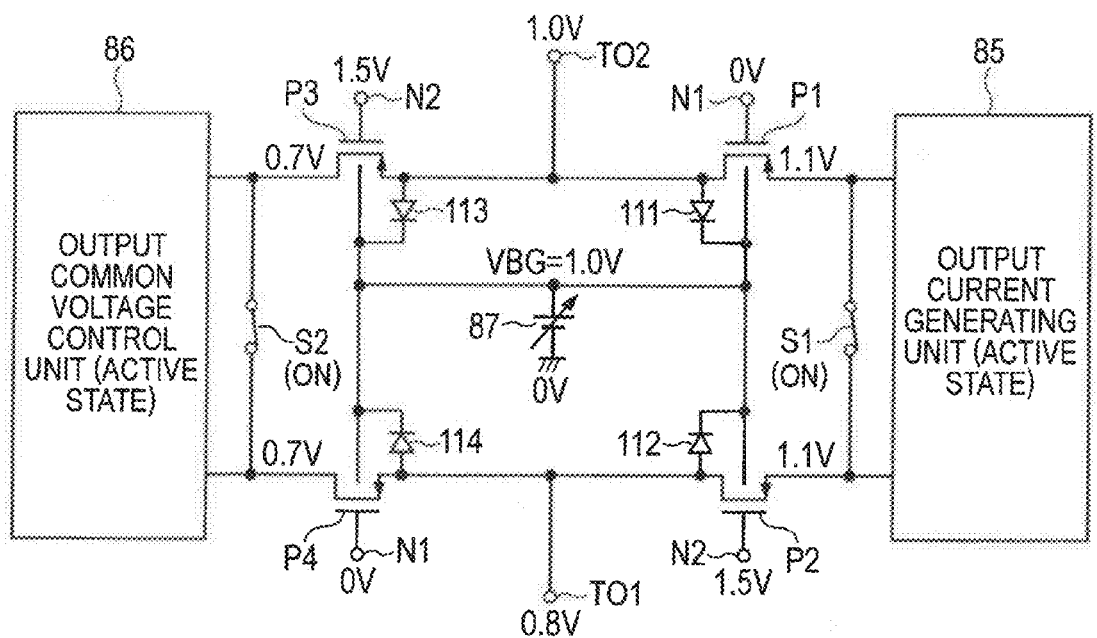
FIG. 18 is a circuit block diagram for explaining necessity of a back gate control unit depicted in FIG. 15.

FIG. 18 illustrates the case where the back-gate voltage VBG is set to 1.0V in the state E. In the state E, 1.0V is applied to the output terminal TO2. In the case where the difference between the voltage (1.0V) of the output terminal TO2 and the back-gate voltage VBG is larger than the threshold voltage of the parasitic diodes 111 and 113, the parasitic diodes 111 and 113 are turned on, and a flow-through current flows from the output terminal TO2 to the back-gate control unit 87 via the parasitic diodes 111 and 113. In the first embodiment, in the state E, the back-gate voltage VBG is set to 1.0V, so that the parasitic diodes 111 and 113 are maintained in the off state, and a flow-through current does not flow from the output terminal TO2 to the back-gate control unit 87 via the parasitic diodes 111 and 113.

In the states E and F, the back-gate voltage VBG is set to 1.0V not 1.8V, so that the gate insulating films 92 of the thin-film P-channel MOS transistors P1 to P4 can be prevented from being destroyed with time by application of a large voltage. Specifically, in the state E, 0V is applied to the gates (nodes N1) of the thin-film P-channel MOS transistors P1 and P4. Consequently, when the back-gate voltage VBG is fixed to 1.8V, there is the possibility that the gate insulating films 92 of the P-channel MOS transistors P1 and P4 are destroyed with time. Similarly, in the state F, 0V is applied to the gates (nodes N2) of the thin-film P-channel MOS transistors P2 and P3. Consequently, when the back-gate voltage VBG is fixed to 1.8V, there is the possibility that the gate insulating films 92 of the P-channel MOS transistors P2 and P3 are destroyed with time. However, in the first embodiment, the voltage applied to the gate insulating films 92 of the thin-film P-channel MOS transistors P1 to P4 is maintained small, and the gate insulating films 92 in the P-channel MOS transistors P1 to P4 can be prevented from being destroyed with time.

In No. 16 in FIG. 16, the difference (VBG−V1) between the back-gate voltage VBG and the voltage V1 of the node N1 lies within the range of 0.3V to 1.0V. No. 17 in FIG. 16 illustrates that the difference (VBG−V2) between the back-gate voltage VBG and the voltage V2 of the node N2 lies in the range of 0.3V to 1.0V. Therefore, the voltage VBG−V1 or VBG−V2 applied to the gate insulating film 92 of each of the P-channel MOS transistors P1 to P4 can be set to the gate withstand voltage (1.5V) or less. By setting the back-gate voltage VBG to 1.0V, the threshold voltage of the P-channel MOS transistors P1 to P4 can be decreased by the back bias effect, and the operation speed of the differential driver 73 can be increased.

As described above, in the first embodiment, the parallel transmission mode and the serial transmission mode are provided. The serializer SR is driven by 1.5V, the drivers 71 to 73 are driven by 1.8V and, in the serial transmission mode, the differential signal of the SubLVDS standard is output. Therefore, the solid-state imaging device commonly using the image data output terminals in different transmission modes such as the parallel transmission mode and the serial transmission mode can be realized. The high data transmission speed by the differential signal can be realized.

Since the switches S1 and S2 are turned off in the states B and C, a flow-through current can be prevented from flowing in the differential driver 73.

Since the back-gate voltage VBG of the P-channel MOS transistors P1 to P4 is set to 1.8V in the parallel transmission mode and is set to 1.0V in the serial transmission mode, the parasitic diodes 111 to 114 of the P-channel MOS transistors P1 to P4 can be prevented from turning on. Since the back-gate voltage VBG is set to 1.0V in the serial transmission mode, the operation speed of the differential driver 73 can be increased by the back-bias effect.

Figure 19:
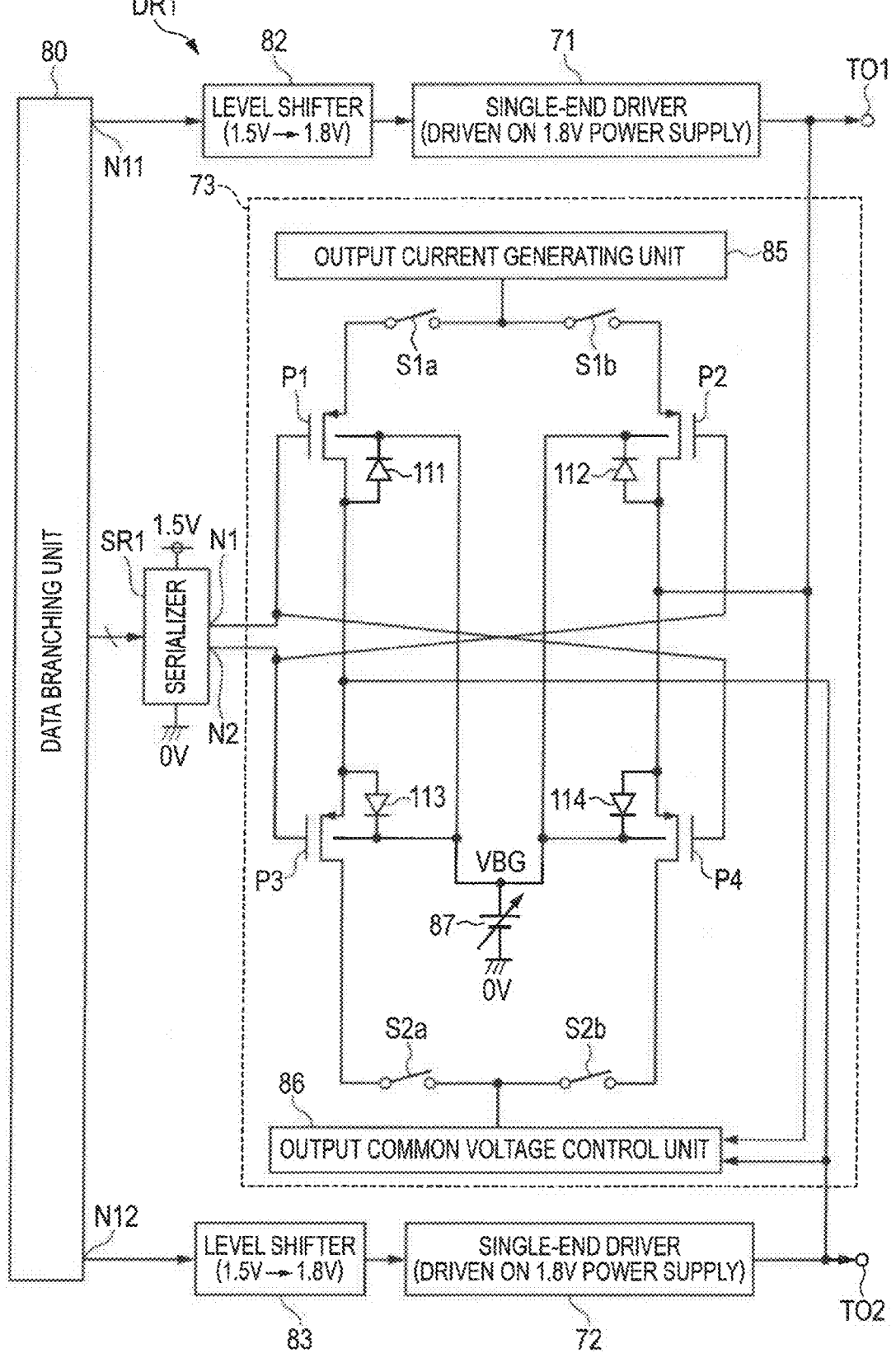
FIG. 19 is a circuit block diagram illustrating a modification of the first embodiment.

FIG. 19 is a circuit block diagram illustrating a modification of the first embodiment, which is compared with FIG. 15. Referring to FIG. 19, in the modification, the switch S1 is divided into two switches S1a and S1b, and the switch S2 is divided into two switches S2a and S2b. The switch S1a is coupled between the output current generating unit 85 and the source of the transistor P1, and the switch S1b is coupled between the output current generating unit 85 and the source of the transistor P2. The switch S2a is coupled between the drain of the transistor P3 and the output common voltage control unit 86, and the switch S2b is coupled between the drain of the transistor P4 and the output common voltage control unit 6.

The switches S1a, S1b, S2a, and S2b are turned on/off at the same timings as those of the switches S1 and S2, are turned off at least in the states B and C in the parallel transmission mode, and are turned on in the serial transmission mode. By the modification, the same effect as that of the first embodiment is obtained.

Figure 20:
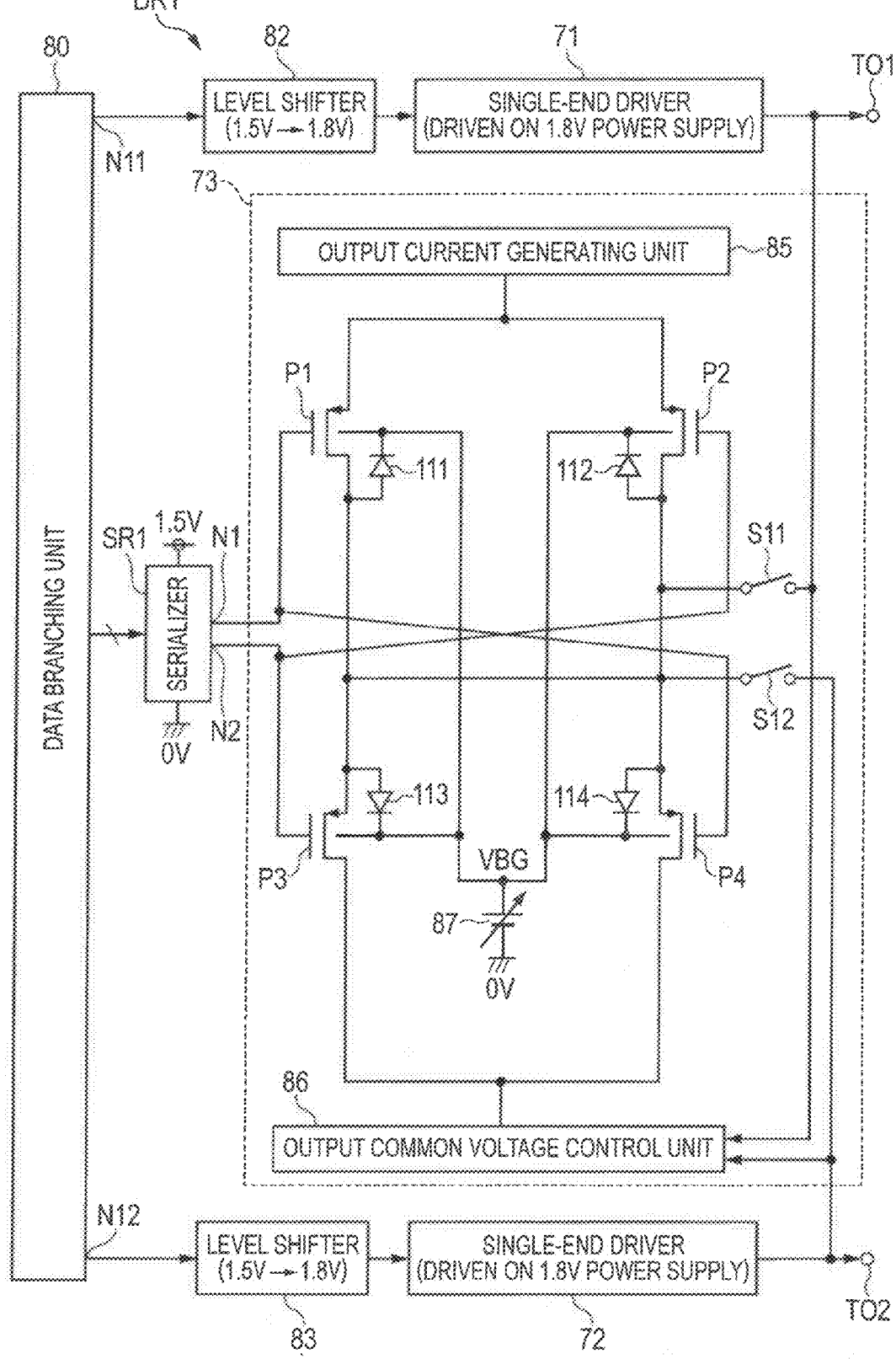
FIG. 20 is a circuit block diagram illustrating a comparative example of the first embodiment.

FIG. 20 is a circuit block diagram illustrating a comparative example of the first embodiment and is a diagram to be compared with FIG. 19. Referring to FIG. 20, in the comparative example, the switches S1a, S1b, S2a, and S2b are not provided but switches S11 and S12 are added. The output current generating unit 85 and the sources of the transistors P1 and P2 are short-circuited, and the drains of the transistors P3 and P4 and the output common voltage control unit 86 are short-circuited.

The switch S11 is coupled between the output terminal TO1 and the drain of the transistor P2, and the switch S12 is coupled between the output terminal TO2 and the drain of the transistor P1. The switches S11 and S12 are turned on/off at the same timings as the switches S1 and S2, are turned off at least in the states B and C in the parallel transmission mode, and are turned on in the serial transmission mode.

In the comparative example, a flow-through current can be prevented from flowing in the states B and C like in the first embodiment. However, the comparative example has a problem that an output signal of the differential driver 73 is delayed by resistance values and parasitic capacitance values of the switches S11 and S12.

Second Embodiment

Figure 21:
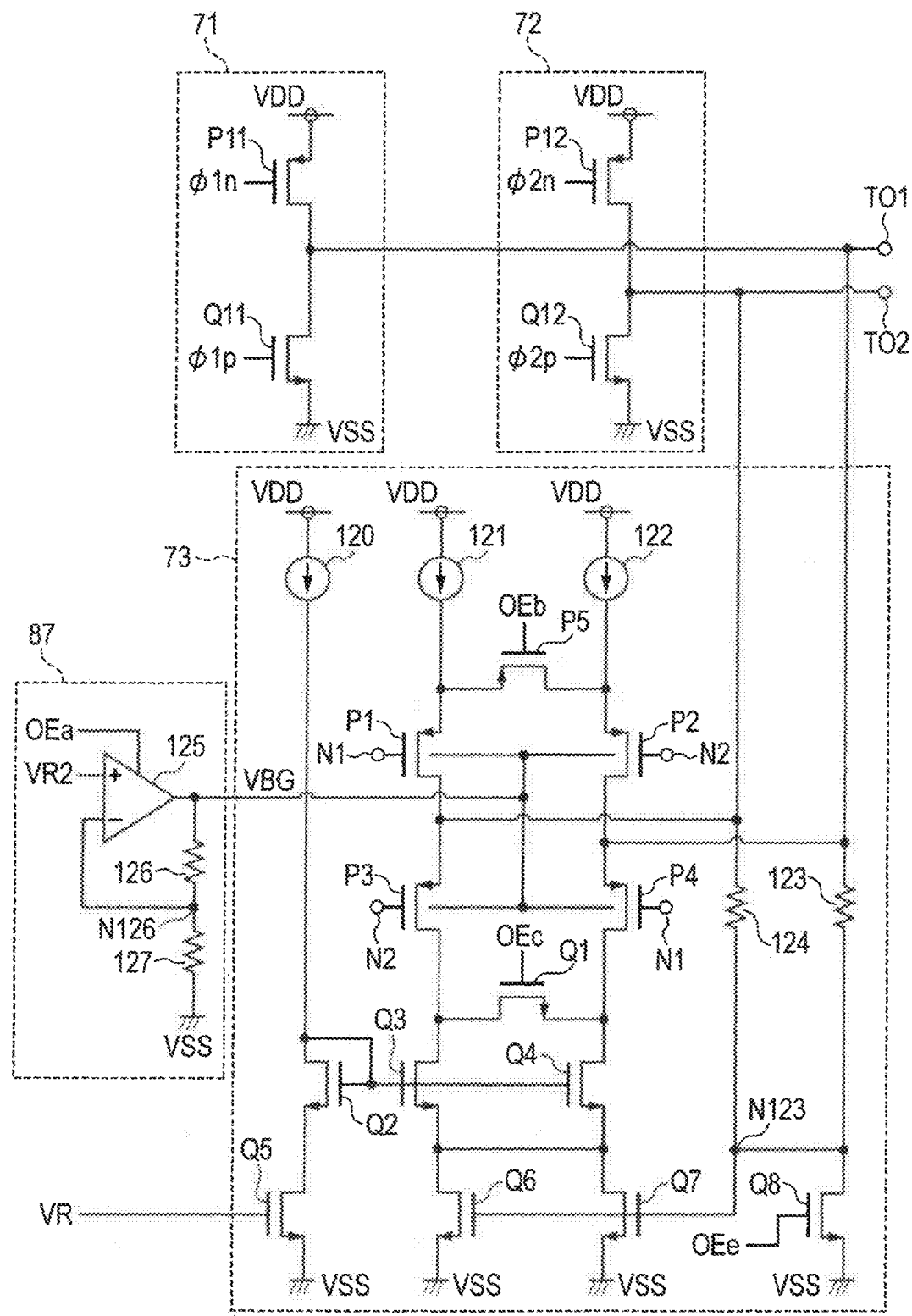
FIG. 21 is a circuit diagram illustrating a main part of a driver of a CMOS image sensor according to a second embodiment of the present application.

FIG. 21 is a circuit diagram illustrating a main part of the driver DR1 of the CMOS image sensor 3 according to a second embodiment of the present application and is a diagram to be compared with FIG. 15. In FIG. 21, the single-end driver 71 includes a thick-film P-channel MOS transistor P11 and a thick-film N-channel MOS transistor Q11. Since the single-end driver 71 includes the transistors P11 and Q11, it is also called a CMOS driver and outputs a single-end signal of the CMOS interface standard. The source of the transistor P11 is coupled to the line of the power supply voltage VDD (1.8V), the gate of the transistor P11 receives an internal data signal □1n, and the drain of the transistor P11 is coupled to the output terminal TO1. The drain of the transistor Q11 is coupled to the output terminal TO1, the gate of the transistor Q11 receives an internal data signal □1p, and the source of the transistor Q11 is coupled to the line of the ground voltage VSS (0V).

In the parallel transmission mode, when both of the internal data signals □1n and □1p are set to the "H" level, the transistor P11 is turned off, the transistor Q11 is turned on, and the output terminal TO1 is set to the "L" level (0V). When both of the internal data signals □1n and □1p are set to the "L" level, the transistor P11 is turned on, the transistor Q11 is turned off, and the output terminal TO1 is set to the "H" level (1.8V).

In the serial transmission mode, the internal data signals □1n and □1p are set to the "H" level and the "L" level, respectively, both of the transistors P11 and Q11 are turned off, and the output nodes of the single-end driver 71 (the drains of the transistors P11 and Q11) are set in the high-impedance state.

The single-end driver 72 includes a thick-film P-channel MOS transistor P12 and a thick-film N-channel MOS transistor Q12. The source of the transistor P12 is coupled to the line of the power supply voltage VDD (1.8V), the gate of the transistor P12 receives an internal data signal □2n, and the drain of the transistor P12 is coupled to the output terminal TO2. The drain of the transistor Q12 is coupled to the output terminal TO2, the gate of the transistor Q12 receives an internal data signal □2p, and the source of the transistor Q12 is coupled to the line of the ground voltage VSS (0V).

In the parallel transmission mode, when both of the internal data signals □2n and □2p are set to the "H" level, the transistor P12 is turned off, the transistor Q12 is turned on, and the output terminal TO2 is set to the "L" level (0V). When both of the internal data signals □2n and □2p are set to the "L" level, the transistor P12 is turned on, the transistor Q12 is turned off, and the output terminal TO2 is set to the "H" level (1.8V).

In the serial transmission mode, the internal data signals □2n and □2p are set to the "H" level and the "L" level, respectively, both of the transistors P12 and Q12 are turned off, and the output nodes of the single-end driver 71 (the drains of the transistors P12 and Q12) are set in the high-impedance state.

In the parallel transmission mode, the single-end drivers 71 and 72 operate independently of each other. In FIG. 21, only an inverter at the final output stage is illustrated in each of the single-end drivers 71 and 72.

The differential driver 73 includes constant current sources 120 to 122, the thin-film P-channel MOS transistors P1 to P4, the thick-film P-channel MOS transistor P5, the thick-film N-channel MOS transistors Q1 to Q4 and Q8, the thin-film N-channel MOS transistors Q5 to Q7, and resistive elements 123 and 124. The transistors P1 to P4 are as described in the first embodiment. The differential driver 73 is also called a SubLVDS driver, and outputs a differential signal of the SubLVDS standard.

The constant current source 120 and the transistors Q2 and Q5 are coupled in series between the line of the power supply voltage VDD and the line of the grounding voltage VSS. The constant current source 121 and the transistors P1, P3, Q3, and Q6 are coupled in series between the line of the power source voltage VDD and the line of the grounding voltage VSS. The constant current source 122 and the transistors P2, P4, Q4, and Q7 are coupled in series between the line of the power source voltage VDD and the line of the grounding voltage VSS.

The output current generating unit 85 is constructed by the constant current sources 120 to 122. The constant current sources 120 to 122 are constructed by, for example, a current mirror circuit using a plurality of thick-film P-channel MOS transistors is configured. In this case, by fixing the gates of the thick-film P-channel MOS transistors to the power supply voltage VDD in the parallel transmission mode, the output current generating unit 85 is inactivated and output of the constant current can be stopped. In the serial transmission mode, the output current of the constant current sources 121 and 122 becomes the output current of the differential driver 73.

The transistor P5 is a component of the switch S1. The source and the drain of the transistor P5 are coupled to the sources of the transistors P1 and P2, respectively, and the gate of the transistor P5 receives a signal OEb. The transistor Q1 is a component of the switch S2. The drain and the source of the transistor Q1 are coupled to the drains of the transistors P3 and P4, respectively, and the gate of the transistor Q1 receives a signal OEc.

In the parallel transmission mode, at least in the states B and C, the signals OEb and OEc are set to the "H" level and the "L" level, respectively, and both of the transistors P5 and Q1 are turned off. Consequently, a flow-through current can be prevented from flowing from one of the output terminals TO1 and TO2 to the other output terminal via the differential driver 73.

In the serial transmission mode, the signals OEb and OEc are set to the "L" level and the "H" level, respectively, and both of the transistors P5 and Q1 are turned on. By the operation, the sources of the transistors P1 and P2 are maintained at the same potential, and the drains of the transistors P3 and P4 are maintained at the same potential.

The output common voltage control unit 86 is configured by the transistors Q2 to Q8 and the resistive elements 123 and 124. The gates of the transistors Q2 to Q4 are coupled to the drain of the transistor Q2. The gate of the transistor Q5 receives a reference voltage VR. The sources of the transistors Q3 and Q4 are coupled to each other. The resistive elements 123 and 124 are coupled in series between the output terminals TO1 and TO2. A node N123 is coupled between the gates of the transistors Q6 and Q7. The transistor Q8 is coupled between the node N123 and the line of the grounding voltage VSS, and its gate receives a signal OEe.

In the parallel transmission mode, the gates of the transistors Q2 to Q4 are set to the grounding voltage VSS, and the transistors Q2 to Q4 are turned off. The signal OEe is set to the "H" level, the transistor Q8 is turned on, and the node N123 is fixed to the grounding voltage VSS (0V). Consequently, the gate voltage of the transistors Q6 and Q7 is fixed to 0V, and a voltage exceeding the withstand voltage is prevented from being applied to the gates of the transistors Q6 and Q7. To prevent leakage of a large current from the output terminals TO1 and TO" to the line of the grounding voltage VSS, elements having a high resistance value are used as the resistive elements 123 and 124.

In the serial transmission mode, the signal OEe is set to the "L" level, the transistor Q8 is turned off, and an intermediate voltage (output common voltage) of the output terminals TO1 and TO2 appears at the node N123 between the resistive elements 123 and 124. By the transistors Q3 to Q7, a common mode feedback circuit for holding the output common voltage at the reference voltage VR applied to the gate of the transistor Q5 is constructed. The transistors Q2 to Q4 are operated in a saturation region, and the transistors Q5 to Q7 are operated in a linear region. The drains of the transistors Q6 and Q7 may not be coupled but may be separated.

The back-gate control unit 87 includes an operational amplifier 125 and resistive elements 126 and 127. A non-inversion input terminal (+ terminal) of the operational amplifier 125 receives a reference voltage VR2, and an output terminal of the operational amplifier 125 is coupled to the back gates of the transistors P1 to P4. The resistive elements 126 and 127 are coupled in series between the output terminal of the operational amplifier 125 and the line of the grounding voltage VSS. The node between the resistive elements 126 and 127 is coupled to the inversion input terminal (− terminal) of the operational amplifier 125. The operational amplifier 125 is controlled by the signal OEa.

In the parallel transmission mode, the signal OEa is set to the "L" level, and the operational amplifier 125 outputs the power supply voltage VDD (1.8V). By the operation, the back gates of the transistors P1 to P4 are fixed to 1.8V, and transistors T11 to T14 of the transistors P1 to P4 are fixed to the off state.

In the serial transmission mode, the signal OEa is set to the "H" level, and the operational amplifier 125 controls the output current so that the voltage of the node N126 matches the reference voltage VR2. By the operation, the back gates of the transistors P1 to P4 are fixed to 1.0V, and the parasitic diodes 111 to 114 of the transistors P1 to P4 are fixed to the off state. The transistors P1 to P4 are prevented from being destroyed with time, and the operation speed of the differential driver 73 is increased.

By an external control using resistors or the like, the resistance value of each of the resistive elements 126 and 127 may be changeable.

Next, the operation of the differential drier 73 in the serial transmission mode will be described more specifically. In the serial transmission mode, when the transistors P1 and P4 are turned on and the transistors P2 and P3 are turned off, current flows from the output terminal TO2 to the output terminal TO1 via the termination resistive element 76 in FIG. 12. On the contrary, when the transistors P2 and P3 are turned on and the transistors P1 and P4 are turned off, current flows from the output terminal TO1 to the output terminal TO2 via the termination resistive element 76 in FIG. 12. Since the direction of the current becomes the logic of an output data signal, it can be said that the differential driver 73 is a circuit of converting the voltage applied to the nodes N1 and N2 to current. Since the differential driver 73 has to stabilize the amplitude of an output signal and output common voltage, it includes many analog circuit elements.

To simplify the description, it is assumed that output current of each of the constant current sources 120 to 122 is 1 mA, the reference voltage VR is 0.9V, and the resistance value of the termination resistive element 76 in FIG. 12 is 100Ω. It is also assumed that the sizes of the transistors Q2 to Q4 are the same and the sizes of the transistors Q5 to Q7 are the same. Under those conditions, the amplitude of the output signal of the differential driver 73 becomes 200 mV, and the output common voltage becomes 0.9V.

That is, in the serial transmission mode, the transistors P5 and Q1 are fixed in the on state. Consequently, when the transistors P1 and P4 are turned on and the transistors P2 and P3 are turned off, the current of 2 mA as the sum of output currents of the constant current sources 121 and 122 flows in a path extending from the output terminal TO2 to the output terminal TO1 via the termination resistive element 76. On the contrary, when the transistors P2 and P3 are turned on and the transistors P1 and P4 are turned off, the current of 2 mA as the sum of output currents of the constant current sources 121 and 122 flows in a path extending from the output terminal TO1 to the output terminal TO2 via the termination resistive element 76. The direction of the current becomes the logic of the output data signal of the differential driver 73. Since the output current is 2 mA and the resistance value of the termination resistive element 76 is 100Ω, the voltage between the output terminals TO1 and TO2, that is, the signal amplitude becomes 200 mV.

The output common voltage is divided by the resistive elements 123 and 124 and the resultant voltage is supplied to the gates of the transistors Q6 and Q7. When the output common voltage increases, the current flowing in the transistors Q3 and Q4 increases, the voltage of the output terminals TO1 and TO2 decreases, and the output common voltage decreases. On the contrary, when the output common voltage decreases, the current flowing in the transistors Q3 and Q4 decreases, the voltage of the output terminals TO1 and TO2 rises, and the output common voltage rises. Therefore, it can be said that the loop is a negative feedback.

Since the output current of the constant current source 120 is 1 mA, current of 1 mA flows in the transistors Q2 and Q5. Since the sum of the output currents of the constant current sources 121 and 122 is 2 mA, the sizes of the transistors Q3 and Q4 are the same, and the sizes of the transistors Q6 and Q7 are the same, the current of 1 mA flows in each of the transistors Q3, Q4, Q6, and Q7.

The gates of the transistors Q2 to Q4 are commonly coupled and the currents of the same value flow in the transistors Q2 to Q4, so that the sources of the transistors Q2 to Q4 have the same potential. The sources of the transistors Q2 to Q4 are the drains of the transistors Q5 to Q7, and the currents of the same value flow in the transistors Q5 to Q7. Since the sources of the transistors Q5 to Q7 are coupled to the line of the grounding voltage VSS, if the gates of the transistors Q5 to Q7 do not have the same potential, the output common voltage control unit 86 does not have a stable state. Therefore, the output common voltage is stabilized at the same potential VR as that of the gate of the transistor Q5 and becomes 0.9V.

From the above, the amplitude of the output signal of the differential driver 73 becomes 200 mV and the output common voltage becomes 0.9V. Since the other configuration and operation are the same as those of the first embodiment, their description will not be repeated. Also by the second embodiment, the same effect as that of the first embodiment is obtained.

In the second embodiment, it is assumed that the output currents of the constant current sources 120 to 122 are equal. The present invention is not limited to the assumption and, for example, the output current of the constant current source 120 may be the half of the output current of the constant current source 121. In this case, the size of the transistor Q2 has to be the half of the size of each of the transistors Q3 and Q4, and the size of the transistor Q5 has to be the half of each of the sizes of the transistors Q6 and Q7.

Figure 22:
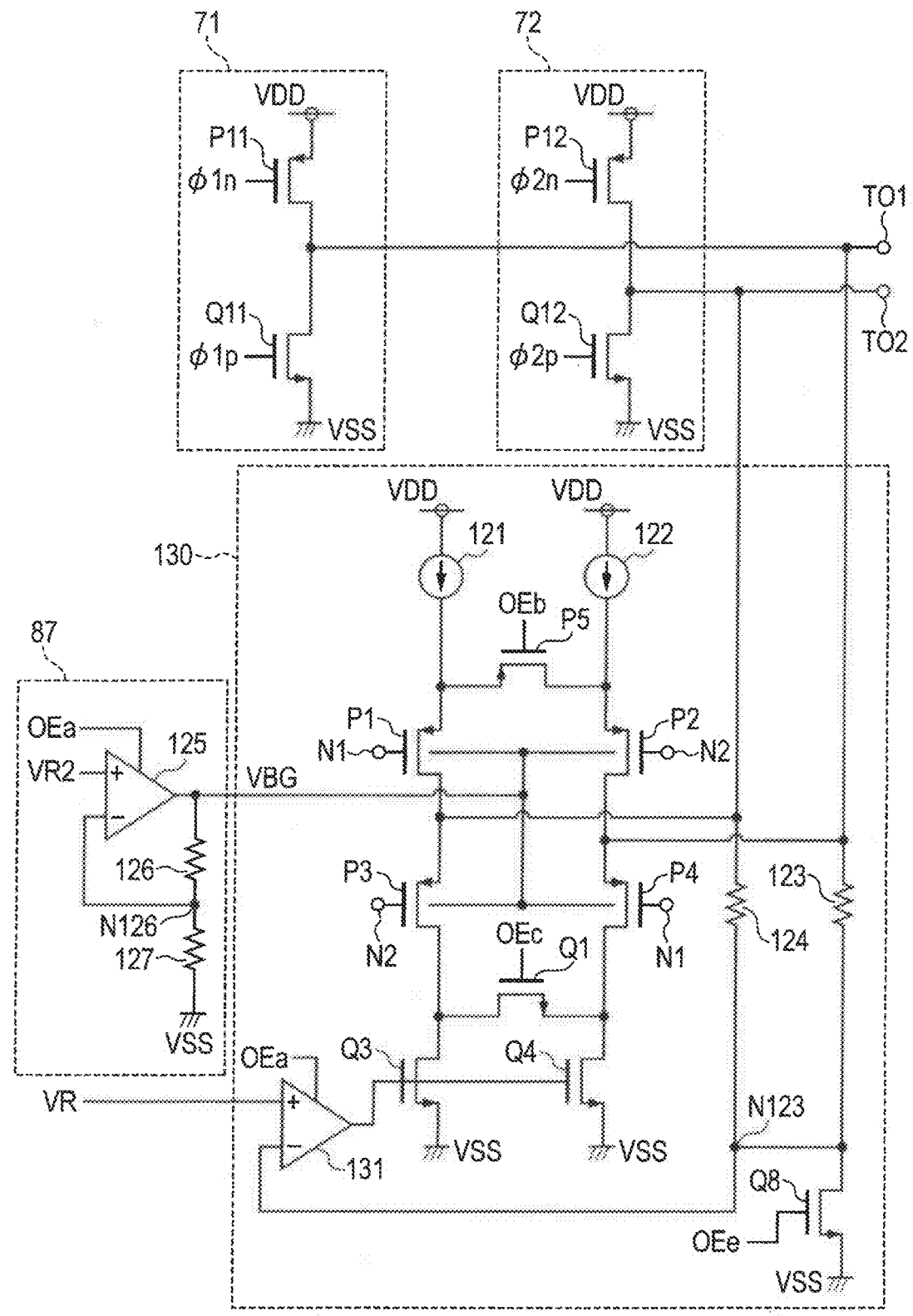
FIG. 22 is a circuit diagram illustrating a modification of the second embodiment.

FIG. 22 is a circuit diagram illustrating a main part of the driver DR1 as a modification of the second embodiment and is a diagram to be compared with FIG. 21. Referring to FIG. 22, the point that the driver DR1 is different from the driver DR1 in FIG. 21 is that the differential driver 73 is replaced by a differential driver 130. The differential driver 130 is obtained by replacing the constant current source 120 and the transistors Q2 and Q5 to Q7 in the differential driver 73 with an operational amplifier 131.

The sources of the transistors Q3 and Q4 are directly coupled to the line of the grounding voltage VSS. The non-inversion input terminal (+ terminal) of the operational amplifier 131 receives the reference voltage VR, the inversion input terminal (− terminal) of the operational amplifier 131 is coupled to the node N123, and the output terminal of the operational amplifier 131 is coupled to the gates of the transistors Q3 and Q4. The operational amplifier 131 is controlled by the signal OEa.

In the parallel transmission mode, the signal OEa is set to the "L" level, and the operational amplifier 125 outputs the grounding voltage VSS (0V). By the operation, the transistors Q3 and Q4 are fixed to the off state.

In the serial transmission mode, the output signal OEa is set to the "H" level, and the operational amplifier 131 controls the gate voltages of the transistors Q3 and Q4 so that the voltage of the node N123 matches the reference voltage VR. By the operation, the output common voltage is fixed to the reference voltage VR. Also by the modification, the same effect as that of the second embodiment is obtained.

Figure 23:
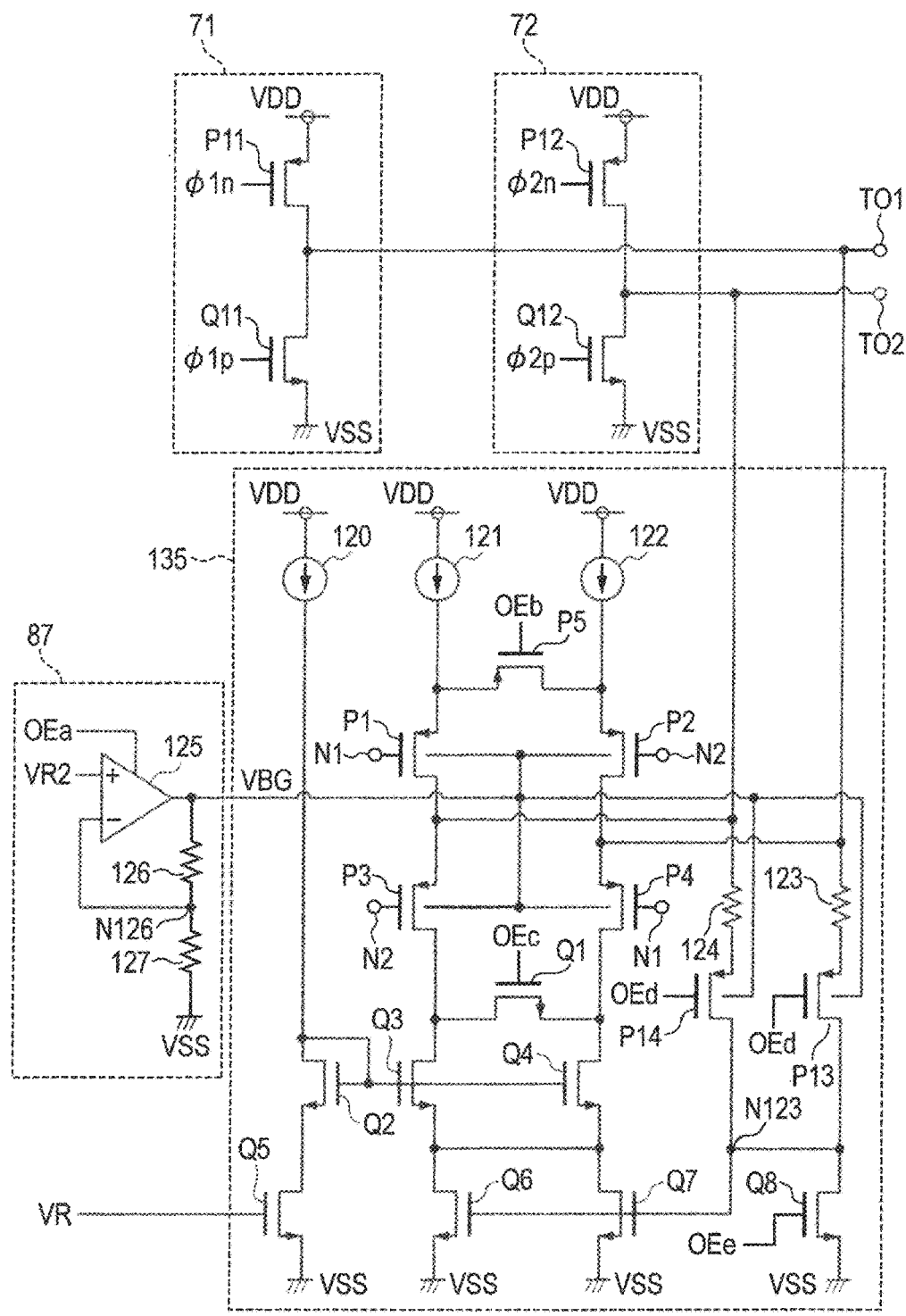
FIG. 23 is a circuit diagram illustrating another modification of the second embodiment.

FIG. 23 is a circuit diagram illustrating a main part of the driver DR1 as another modification of the second embodiment and is a diagram to be compared with FIG. 21. Referring to FIG. 23, the point that the driver DR1 is different from the driver DR1 in FIG. 21 is that the differential driver 73 is replaced by a differential driver 135. The differential driver 135 is obtained by adding thin-film P-channel MOS transistors P13 and P14 to the differential driver 73.

The resistive element 123 and the transistor P13 are coupled in series between the output terminal TO1 and the node N123. The resistive element 124 and the transistor P14 are coupled in series between the output terminal TO2 and the node N123. The gates of the transistors P13 and P14 receive the signal OEd, and the back gates of the transistors P13 and P14 receive the output voltage VBG of the back-gate control unit 87.

In the parallel transmission mode, the signal OEd is set to the "H" level (1.5V), and the transistors P13 and P14 are turned off. By the operation, currents flowing in the resistive elements 123 and 124 in the parallel transmission mode are reduced.

In the serial transmission mode, the output signal OEd is set to the "L" level (0V), the transistors P13 and P14 are turned on, and the voltage of the node N123 is set to the reference voltage VR. Also by the modification, the same effect as that of the second embodiment is obtained, and the consumption current can be reduced.

Figure 24:
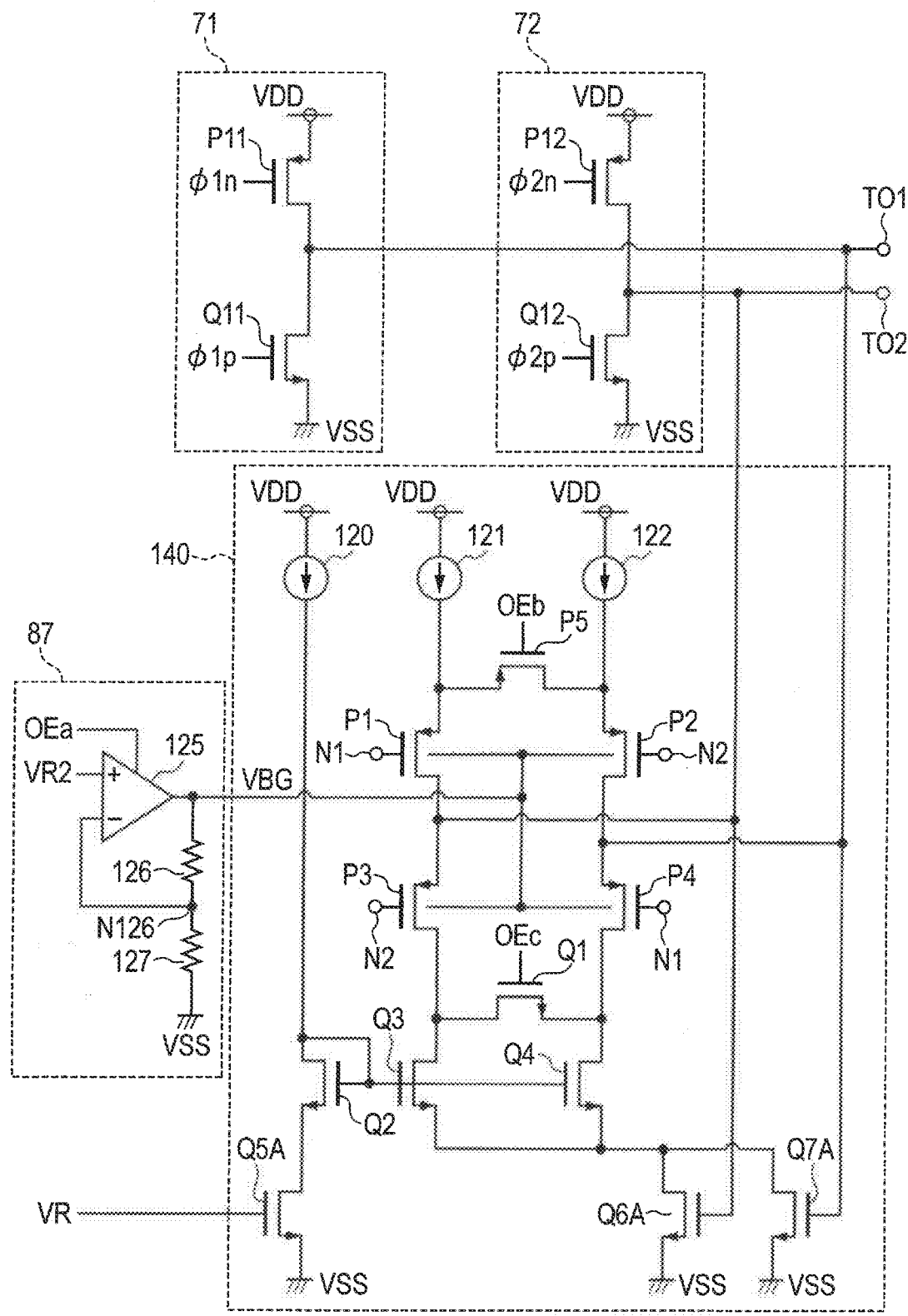
FIG. 24 is a circuit diagram illustrating further another modification of the second embodiment.

FIG. 24 is a circuit diagram illustrating a main part of the driver DR1 as further another modification of the second embodiment and is a diagram to be compared with FIG. 21. Referring to FIG. 24, the point that the driver DR1 is different from the driver DR1 in FIG. 21 is that the differential driver 73 is replaced by a differential driver 140. The differential driver 140 is obtained by removing the resistive elements 123 and 124 and the transistor Q8 in the differential driver 73 and replacing the thin-film N-channel MOS transistors Q5 to Q7 with thick-film N-channel MOS transistors Q5A to Q7A, respectively. The gates of the transistors Q6A and Q7A are coupled to the output terminals TO2 and TO1, respectively.

In the parallel transmission mode, the constant current sources 120 to 122 are inactivated, the transistors Q2 to Q4 are turned off, and the differential driver 140 is inactivated.

In the serial transmission mode, the constant current sources 120 to 122 are activated, the transistors Q2 to Q4 are turned on, and the differential driver 140 is activated. A negative feedback operation is performed so that the average of gate voltages of the transistors Q6A and Q7A, that is, the output common voltage becomes the reference voltage VR.

That is, when the output common voltage increases, the current flowing in the transistors Q6A, Q7A, Q3, and Q4 increases, the voltages of the output terminals TO1 and TO2 decrease, and the output common voltage decreases. On the contrary, when the output common voltage decreases, the current flowing in the transistors Q6A, Q7A, Q3, and Q4 decreases, the voltages of the output terminals TO1 and TO2 rise, and the output common voltage rises. Therefore, it can be said that the loop is a negative feedback.

By the modification, the same effect as that of the second embodiment is obtained and, in addition, the currents flowing out from the output terminals TO1 and TO2 via the resistive elements 123 and 124 can be reduced.

Figure 25:
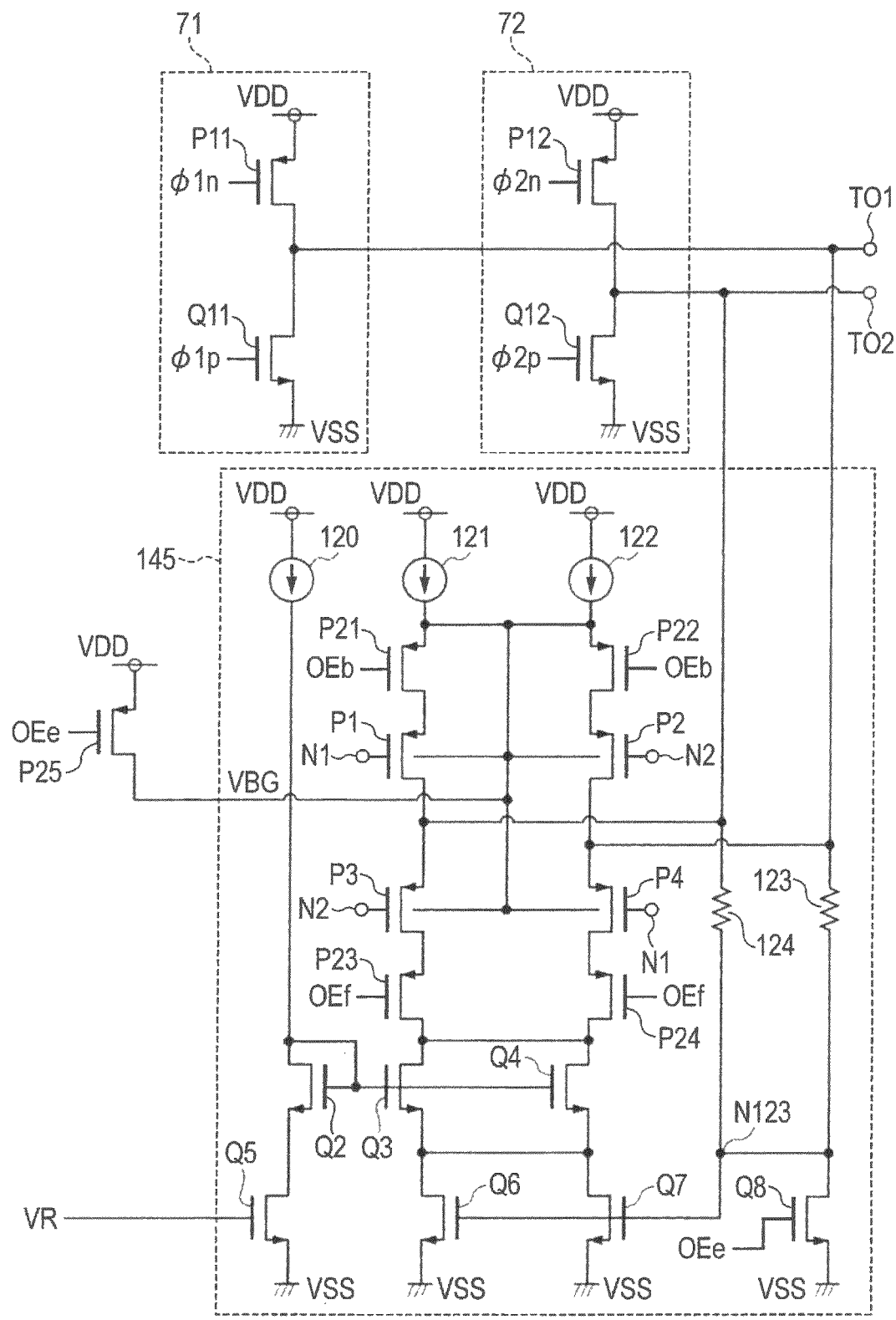
FIG. 25 is a circuit diagram illustrating further another modification of the second embodiment.

FIG. 25 is a circuit diagram illustrating a main part of the driver DR1 as further another modification of the second embodiment and is a diagram to be compared with FIG. 21. Referring to FIG. 25, the point that the driver DR1 is different from the driver DR1 in FIG. 21 is that the differential driver 73 is replaced by a differential driver 145. The differential driver 145 is obtained by replacing the thick-film P-channel MOS transistor P5 in the differential driver 73 with thick-film P-channel MOS transistors P21 and P22, replacing the thick-film N-channel MOS transistor Q1 with thick-film P-channel MOS transistors P23 and P24, removing the back-gate control unit 87, and adding a thick-film P-channel MOS transistor P25.

The sources of the transistors P21 and P22 are directly coupled to the output nodes of the constant current sources 121 and 122, the gates of the transistors P21 and P22 receive the signal OEb, and the drains of the transistors P21 and P22 are coupled to the sources of the transistors P1 and P2, respectively. The sources of the transistors P21 and P22 are coupled to the back gates of the transistors P1 to P4.

The sources of the transistors P23 and P24 are coupled to the drains of the transistors P3 and P4, the gates of the transistors P23 and P24 receive a signal OEf, and the drains of the transistors P23 and P24 are coupled to the drains of the transistors Q3 and Q4, respectively. The drains of the transistors P23 and P24 are coupled to each other.

The source of the transistor P25 is coupled to the line of the power supply voltage VDD, the gate of the transistor P25 receives a signal OEe, and the drain of the transistor P25 is coupled to the back gates of the transistors P1 to P4.

In the parallel transmission mode, the constant current sources 120 to 122 are inactivated, the transistors Q2 to Q4 are turned off, and the differential driver 145 is inactivated. In the single-end transmission mode, at least in the states B and C, both of the signals OEb and OEf are set to the "H" level, and the transistors P21 to P24 are turned off. By the operation, a flow-through current can be prevented from flowing from one of the output terminals TO1 and TO2 to the other output terminal via the differential driver 73. The signal OEe is set to the "L" level, the transistor P25 is turned on, and 1.8V is applied to the back gates of the transistors P1 to P4.

In the serial transmission mode, the constant current sources 120 to 122 are activated, the transistors Q2 to Q4 are turned on, and the differential driver 145 is activated. Both of the signals OEb and OEf are set to the "L" level, and the transistors P21 to P24 are turned on. A self bias voltage generating in the sources of the transistors P21 and P22 is applied to the back gates of the transistors P1 to P4.

Since the other configuration and operation are the same as those of the second embodiment, their description will not be repeated. By the modification, the same effect as that of the second embodiment is obtained. In addition, since the operational amplifier 125 is eliminated, the circuit area can be reduced. However, the back-gate voltages of the transistors P1 to P4 cannot be freely adjusted, so that the operational speed of the differential driver 145 cannot be increased by the back bias effect.

The transistors P23 and P24 may be replaced by the transistor Q1 in FIG. 22.

Third Embodiment

Figure 26:
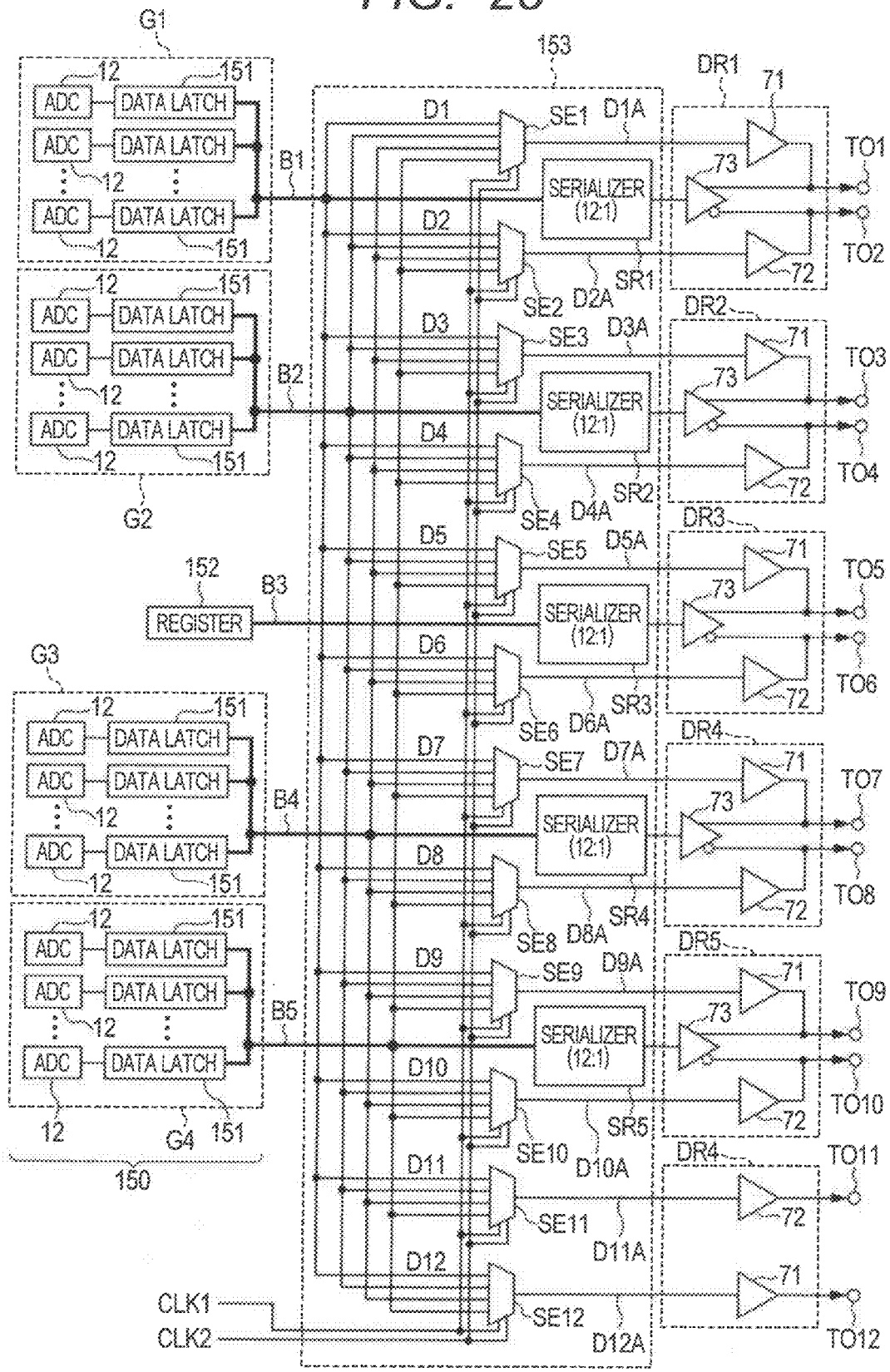
FIG. 26 is a circuit block diagram illustrating a main part of a CMOS image sensor according to a third embodiment of the present application.

FIG. 26 is a circuit block diagram illustrating a main part of a CMOS image sensor according to a third embodiment of the present application. In FIG. 26, the CMOS image sensor includes an AD converting unit 150, data buses B1 to B5, a core logic 153, drivers DR1 to DR6, and output terminals TO1 to TO12. The general configuration of the CMOS image sensor is similar to that of the CMOS image sensor 3 of the first embodiment. The photoelectric converting unit 4 illustrated in FIG. 1 is not depicted here. The lore logic 153 is driven by DC power supply voltage (1.5V) and grounding voltage (0V), and the drivers DR1 to DR6 are driven by DC power supply voltage (1.8V) and grounding voltage (0V).

The photoelectric converting unit 4 (not illustrated) has, as described in the first embodiment, the pixel array 11, and the pixel array 11 includes a plurality of pixels PX arranged in a plurality of rows and a plurality of columns. Each of the pixels PX converts incident light to an analog signal. The analog signal has a voltage of a level according to the intensity of the incident light.

The AD converting unit 150 includes a plurality of sets of column ADCs 12 and data latches 151 and a register 152. The plurality of column ADCs 12 are provided in correspondence with a plurality of columns of the pixel array 11 as described in the first embodiment. Each of the column ADCs 12 converts an analog signal read from the pixel PX in a selected row of a corresponding column to a plurality of data signals. The data latch 151 has a first mode of holding and outputting output data of a corresponding column ADC 12 and a second mode of setting the output node to a high-impedance state. The first and second modes can be switched.

The plurality of sets of column ADCs 12 and the data latches 151 are equally divided into four ADC groups G1 to G4. The plurality of data latches 151 belonging to the ADC group G1 output data signals D1 to D12 of 12 bits to one end of a data bus B1. The plurality of data latches 151 belonging to the ADC group G2 output data signals D1 to D12 of 12 bits to one end of a data bus B2. The plurality of data latches 151 belonging to the ADC group G3 output data signals D1 to D12 of 12 bits to one end of a data bus B4. The plurality of data latches 151 belonging to the ADC group G4 output data signals D1 to D12 of 12 bits to one end of a data bus B5.

In the register 152, predetermined data signals D1 to D12 of 12 bits are stored. The register 152 outputs the data signals D1 to D12 to one end of a data bus B3.

The core logic unit 153 includes 12 selectors SE1 to SE12 and five serializers SR1 to SR5. The selector SE1 is coupled to the data buses B1, B2, B4, and B5 and receives the data signal D1 as the lowest bit (least significant bit) in the data signals D1 to D12 output in parallel from each of the ADC groups G1 to G4 in the parallel transmission mode. The selector SE1 operates synchronously with clock signals CLK1 and CLK2 and sequentially outputs four data signals D1 received from the ADC groups G1 to G4 by predetermined time.

Specifically, each of the clock signals CLK1 and CLK2 is a signal alternatively repeating the "L" level (0) and the "H" level (1). The cycle of the clock signal CLK2 is twice of the cycle of the clock signal CLK1. The logic levels of the clock signals CLK1 and CLK2 change in a predetermined cycle (the cycle of the clock signal CLK2) like 00, 10, 01, and 11. The selector SE1 operates synchronously with the clock signals CLK1 and CLK2 and sequentially outputs the four data signals D1 received from the ADC groups G1 to G4 by predetermined time (the half cycle of the clock signal CLK1).

The selector SE2 is coupled to the data buses B1, B2, B4, and B5 and receives the data signal D2 as the second lowest bit in the data signals D1 to D12 output in parallel from each of the ADC groups G1 to G4 in the parallel transmission mode. The selector SE2 operates synchronously with clock signals CLK1 and CLK2 and sequentially outputs four data signals D2 received from the ADC groups G1 to G4 by predetermined time.

The selectors SE3 to SE11 are similar to the above. The selector SE12 is coupled to the data buses B1, B2, B4, and B5 and receives the data signal D12 as the 12th lowest bit (most significant bit) in the data signals D1 to D12 output in parallel from each of the ADC groups G1 to G4 in the parallel transmission mode. The selector SE12 operates synchronously with clock signals CLK1 and CLK2 and sequentially outputs four data signals D12 received from the ADC groups G1 to G4 by predetermined time. The data signals output from the selectors SE1 to SE12 will be set as D1A to D12A.

The serializer SR1 is coupled to the other end of the data bus B1 and, in the serial transmission mode, serially outputs the data signals D1 to D12 output in parallel from the ADC group G1 within predetermined time (the half cycle of the clock signal CLK1). The serializer SR2 is coupled to the other end of the data bus B2 and, in the serial transmission mode, serially outputs the data signals D1 to D12 output in parallel from the ADC group G2 within predetermined time. The serializer SR3 is coupled to the other end of the data bus B3 and, in the serial transmission mode, serially outputs the data signals D1 to D12 output in parallel from the register 152.

The serializer SR4 is coupled to the other end of the data bus B4 and, in the serial transmission mode, serially outputs the data signals D1 to D12 output in parallel from the ADC group G3 within predetermined time. The serializer SR5 is coupled to the other end of the data bus B5 and, in the serial transmission mode, serially outputs the data signals D1 to D12 output in parallel from the ADC group G4 within predetermined time. The "H" level of an output signal from each of the serializers SR1 to SR5 is 1.5V, and the "L" level is 0V.

Each of the drivers DR1 to DR5 includes the single-end drivers 71 and 72 and the differential driver 73. The driver DR6 includes the single-end drivers 71 and 72. The single-end drivers 71 and 72 of the drivers DR1 to DR6 are activated in the parallel transmission mode and output the data signals D1A to D12A supplied from the selectors SE1 to SE12 in parallel to the output terminals TO1 to TO12 as 12 single-end signals of the CMOS interface standard. The "H" level of the single-end signal is 1.8V and the "L" level is 0V.

The differential driver 73 of the driver DR1 is activated in the serial transmission mode and outputs the data signals D1 to D12 supplied from the corresponding serializer SR1 as 12 differential signals of the SubLVDS standard in series to the corresponding output terminals TO1 and TO2. The differential driver 73 of the driver DR2 is activated in the serial transmission mode and outputs the data signals D1 to D12 supplied from the corresponding serializer SR2 as 12 differential signals of the SubLVDS standard in parallel to the corresponding output terminals TO3 and TO4.

The differential drivers 73 in the drivers DR2 to DR4 are similar to the above. The differential driver 73 of the driver DR5 is activated in the serial transmission mode and outputs the data signals D1 to D12 supplied from the corresponding serializer SR5 as 12 differential signals of the SubLVDS standard in series to the corresponding output terminals TO9 and TO10. The differential signal includes two signals supplied to corresponding two output terminals, respectively. According to the logic level of the data signal D, one of the two signals is set to the "H" level (1.0V) and the other signal is set to the "L" level (0.8V).

Figure 27:
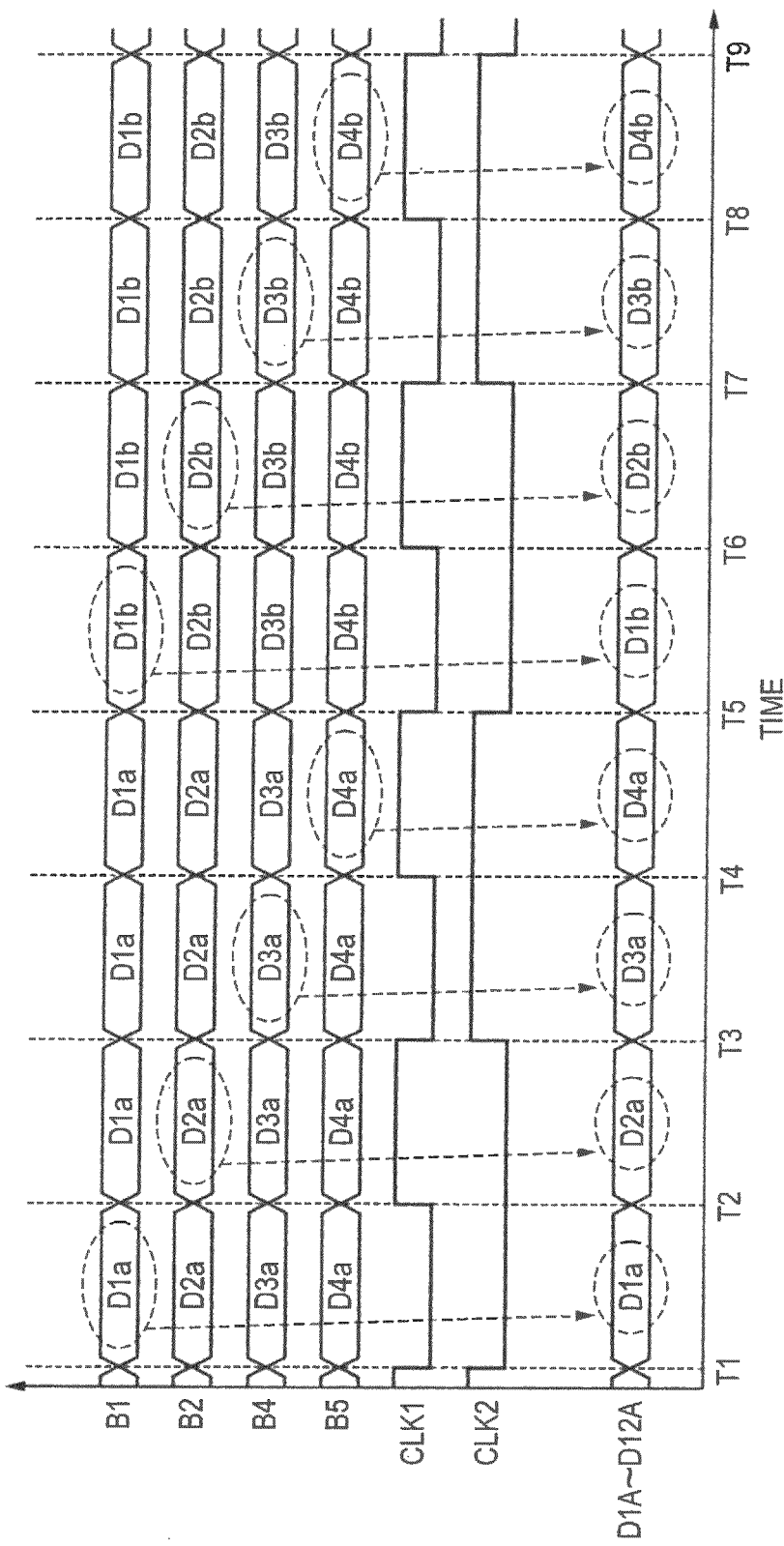
FIG. 27 is a timing chart illustrating operations in a parallel transmission mode of the CMOS image sensor depicted in FIG. 26.

FIG. 27 is a timing chart illustrating operations of the CMOS image sensor in the parallel transmission mode. In FIG. 27, the clock signal CLK1 alternatively becomes the "L" level (0) and the "H" level (1) in predetermined cycles, and the clock signal CLK2 alternatively becomes the "L" level and the "H" level in the cycle which is twice of that of the clock signal CLK1. The logic levels of the clock signals CLK1 and CLK2 sequentially change like 00, 10, 01, and 11.

In FIG. 27, the logic levels of the clock signals CLK1 and CLK2 change like 00, 10, 01, and 11 at times T1, T2, T3, and T4, respectively and, further, change like 00, 10, 01, and 11 at times T5, T6, T7, and T8, respectively. In the period from the time T1 to the time T5, data D1a to D4a is supplied from the ADC groups G1, G2, G3, and G4 to data buses B1, B2, B3, and B4, respectively. Each of the data D1a to D4a includes data signals D1 to D12. In the period from time T5 to time T9, data D1b to D4b is supplied from the ADC groups G1, G2, G3, and G4 to the data buses B1, B2, B3, and B4, respectively. Each of the data D1b to D4b includes the data signals D1 to D12.

In the period from T1 to T2 in which the logic level of the clock signals CLK1 and CLK2 becomes 00, the data signals D1 to D12 (the data D1a) of the data bus B1 are selected by the selectors SE1 to SE12, and the selected data signals D1 to D12 (the data D1a) become the data signals D1A to D12A.

In the period from T2 to T3 in which the logic level of the clock signals CLK1 and CLK2 becomes 10, the data signals D1 to D12 (the data D2a) of the data bus B2 are selected by the selectors SE1 to SE12, and the selected data signals D1 to D12 (the data D2a) become the data signals D1A to D12A.

In the period from T3 to T4 in which the logic level of the clock signals CLK1 and CLK2 becomes 01, the data signals D1 to D12 (the data D3a) of the data bus B4 are selected by the selectors SE1 to SE12, and the selected data signals D1 to D12 (the data D3a) become the data signals D1A to D12A.

In the period from T4 to T5 in which the logic level of the clock signals CLK1 and CLK2 becomes 11, the data signals D1 to D12 (the data D4a) of the data bus B5 are selected by the selectors SE1 to SE12, and the selected data signals D1 to D12 (the data D4a) become the data signals D1A to D12A.

That is, the data D1a to D4a is output from the ADC groups G1 to G4 to the data buses B1, B2, B4, and B5 only in one cycle (from time T1 to time T5) of the clock signal CLK2, and the data D1a to D4a is sequentially selected by the selectors SE1 to SE12 by half cycle of the clock signal CLK1. Each piece of the data D1a to D4a is converted to 12 pieces of single-end signals by the single-end drivers 71 and 72 of the drivers DR1 to DR6, and the single-end signals are output in parallel to the output terminals TO1 to TO12.

FIG. 28A is a timing chart illustrating operations of the CMOS image sensor in the serial transmission mode, and FIG. 28B is a timing chart illustrating operations of the CMOS image sensor in the parallel transmission mode. Although the parallel transmission mode has been described with reference to FIG. 27, FIG. 28B is provided for comparison with the serial transmission mode.

In FIG. 28A, in the serial transmission mode, the data D1a, D1b, D1c, . . . is sequentially output from the ADC group G1 to the data bus B1 by predetermined time (the half cycle of the clock signal CLK1), and the data D2a, D2b, D2c, . . . is sequentially output from the ADC group G2 to the data bus B2 by predetermined time. The data D3a, D3b, D3c, . . . is sequentially output from the ADC group G3 to the data bus B4 by predetermined time, and the data D4a, D4b, D4c, is sequentially output from the ADC group G4 to the data bus B5 by predetermined time.

That is, in the period from the time T1 to time T2, the data D1a to D4a is supplied to the data buses B1, B2, B4, and B5. Each of the data D1a to D4a includes the parallel data signals D1 to D12. The parallel data signals D1 to D12 in the data bus B1 are converted to serial data signals D1 to D12 by the serializer SR1 in the period from T1 to T2, and each of the data signals D is converted to a differential signal by the differential driver 73 of the driver DR1, and the differential signal is supplied to the output terminals TO1 and TO2.

The parallel data signals D1 to D12 in the data bus B2 are converted to serial data signals D1 to D12 by the serializer SR2 in the period from time T1 to T2, and each of the data signals D is converted to a differential signal by the differential driver 73 of the driver DR2, and the differential signal is supplied to the output terminals TO3 and TO4.

The parallel data signals D1 to D12 in the data bus B4 are converted to serial data signals D1 to D12 by the serializer SR4 in the period from time T1 to T2, and each of the data signals D is converted to a differential signal by the differential driver 73 of the driver DR4, and the differential signal is supplied to the output terminals TO7 and TO8.

The parallel data signals D1 to D12 in the data bus B5 are converted to serial data signals D1 to D12 by the serializer SR5 in the period from time T1 to T2, and each of the data signals D is converted to a differential signal by the differential driver 73 of the driver DR5, and the differential signal is supplied to the output terminals TO9 and TO10.

Referring to FIGS. 28A and 28B, in the serial transmission mode, the output data D1a to D4a of the ADC groups G1 to G4 is output to the outside in the period of the time T1 to T2 (the half period of the clock signal CLK1). On the other hand, in the parallel transmission mode, the output data D1a to D4a of the ADC groups G1 to G4 is output to the outside in the period from time T1 to T5 (two cycles of the clock signal CLK1). Therefore, the data transmission speed in the serial transmission mode is four times as fast as the data transmission speed in the parallel transmission mode.

The data signals D1 to D12 output in parallel from the register 152 are fixed to, for example, 010101010101. The serializer SR3 converts the output data signals D1 to D12 of the register 152 to serial signals within the half cycle of the clock signal CLK1. Each of the output data signals D1 to D12 of the serializer SR3 to a differential signal by the differential driver 73 of the driver DR3, and the differential signal is output to the output terminals TO5 and TO6. The signals output to the output terminals TO5 and TO6 are used as clock signals for source synchronization in the image processing engine 7.

Figure 29:
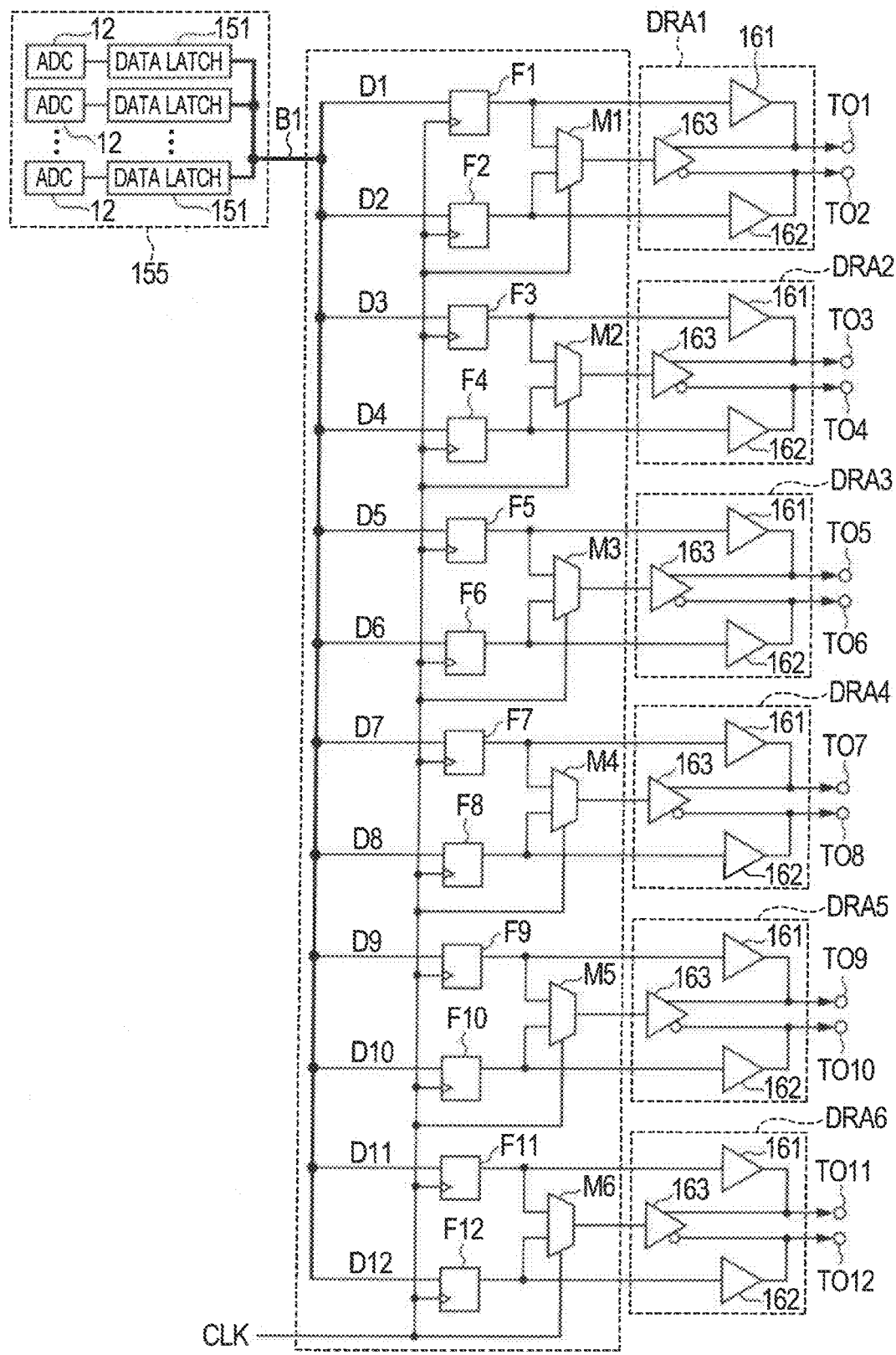
FIG. 29 is a circuit block diagram illustrating a comparative example of the third embodiment.

FIG. 29 is a circuit block diagram illustrating a main part of a CMOS image sensor as a comparative example of the third embodiment and is a diagram to be compared with FIG. 26. In FIG. 29, the CMOS image sensor includes a photoelectric converting unit (not illustrated), an AD converting unit 155, a data bus B1, a core logic 160, drivers DRA1 to DRA6, and output terminals TO1 to TO12. The core logic 155 and the drivers DRA1 to DRA6 are driven by DC power supply voltage (3.3V) and grounding voltage (0V).

The AD converting unit 155 includes a plurality of sets of column ADCs 12 and data latches 151. Each of the column ADC 12 and the data latch 151 is as described with reference to FIG. 26. In the AD converting unit 150, the plurality of sets of column ADCs 12 and the data latches 151 are not divided into a plurality of ADC groups. The AD converting unit 155 operates synchronously with the clock signal CLK and outputs data signals D1 to D12 of 12 bits to one end of the data bus B1.

The core logic unit 160 includes 12 flip flops F1 to F12 and six multiplexers M1 to M6. The data input terminals of the flip flops F1 to F12 are coupled to the other end of the data bus B1 and receive data signals D1 to D12. The flip flops F1 to F12 take the data signals D1 to D12 in response to the rising edge of the clock signal CLK and hold and output the taken data signals D1 to D12. The output data signals D1 to D12 of the flip flops F1 to F12 change every cycle of the clock signal CLK.

Each of the multiplexers M1 to M6 includes a first input node, a second input node, and an output node. The first nodes of the multiplexers M1, M2, M3, M4, M5, and M6 receive the output data signals D1, D3, D5, D7, D9, and D11 of the flip flops F1, F3, F5, F7, F9, and F11, respectively. The second input nodes of the multiplexers M1, M2, M3, M4, M5, and M6 receive the output data signals D2, D4, D6, D8, D10, and D12 of the flip flops F2, F4, F6, F8, F10, and F12.

Each of the multiplexers M1 to M6 couples the first input node and the output node in the period in which the clock signal CLK is at the "H" level and couples the second input node and the output node in the period in which the clock signal CLK is at the "L" level. Therefore, the multiplexers M1, M2, M3, M4, M5, and M6 output the data signals D1, D3, D5, D7, D9, and D11 in the period in which the clock signal CLK is at the "H" level, and output the data signals D2, D4, D6, D8, D10, and D12 in the period in which the clock signal CLK is at the "L" level. The "H" level of the output data signal of each of the multiplexers M1 to M6 is 3.3V, and the "L" level of the signal is 0V.

Each of the drivers DRA1 to DRA6 includes single-end drivers 161 and 162 and a differential driver 163. The single-end drivers 161 and 162 in the drivers DRA1 to DRA6 are activated in the single-end transmission mode, convert the output data signals D1 to D12 of the flip flops F1 to F12 to 12 single-end signals, and output the single-end signals in parallel to the output terminals TO1 to TO12. The "H" level of the single-end signal is 3.3V, and the "L" level is 0V.

The differential driver 163 of the driver DRA1 is activated in the differential transmission mode, converts the output data signal of the multiplexer M1 to a differential signal of the LVDS standard, and outputs the differential signal to the output terminals TO1 and TO2. According to the logic level of the output data signal D1 of the multiplexer M1, the differential driver 163 sets one of the output terminals TO1 and TO2 to the "H" level (1.425V) and sets the other output terminal to the "L" level (1.075V).

The differential driver 163 of the driver DRA2 is activated in the differential transmission mode, converts the output data signal of the multiplexer M2 to a differential signal of the LVDS standard, and outputs the differential signal to the output terminals TO3 and TO4. The differential drivers 163 of the drivers DRA3 to DRA5 are similar to the above. The differential driver 163 of the driver DRA6 is activated in the differential transmission mode, converts the output data signal of the multiplexer M6 to a differential signal of the LVDS standard, and outputs the differential signal to the output terminals TO11 and TO12.

Therefore, in the CMOS image sensor, in the single-end transmission mode, 12 data signals D1 to D12 are output in parallel as 12 single-end signals to the output terminals TO1 to TO12 only in one cycle of the clock signal CLK. In the differential transmission mode, six odd-numbered data signals are output as six differential signals in parallel to the output terminals TO1 to TO12 only in the first-half cycle of the clock signal CLK, and six even-numbered data signals are output as six differential signals in parallel to the output terminals TO1 to TO12 only in the latter-half cycle of the clock signal CLK. Therefore, in the CMOS image sensor, the data transmission speed in the differential transmission mode is the same as that in the single-end transmission mode and is lower than that in the serial transmission mode of the third embodiment. The CMOS image sensor of the comparative example is disclosed in, for example, patent literature 1.

In the comparative example, the "H" level of the input data signal of the differential driver 163 is 3.3V, and the "L" level is 0V. The differential driver 163 outputs the "H" level (1.425V) and the "L" level (1.075V) to two output nodes, or outputs the "L" level (0V) and the "H" level (1.425V). Therefore, the input/output potential difference of the differential driver 163 becomes 1.875V/−1.075V. Since 1.875V>|−1.075V|, an N-channel MOS transistor is turned more easily than a P-channel MOS transistor, and the potential difference of 1.875V is a voltage sufficient to turn on a thick-film N-channel MOS transistor.

It is considered to develop a CMOS image sensor of higher data transmission speed and lower power consumption as compared with the CMOS image sensor of the comparative example. First, the plurality of sets of column ADCs 12 and the data latches 151 in the AD converting unit 150 are divided into a plurality of ADC groups G, data buses B are provided in correspondence with the ADC groups G, and the multiplexers M are replaced by serializers SR of 12:1.

As a result, since the operation frequency of the serializer SR is high, increase in power consumption is caused. However, by decreasing the DC power supply voltage of the core logic from 3.3V to 1.5V and using a thin-film MOS transistor adapted to high-speed operation, power consumption is lowered. To decrease power consumption of the differential driver, the DC power supply voltage is decreased from 3.3V to 1.8V, the "H" level of the output signal level of the differential driver is changed to 1.0V, and the "L" level is changed to the SubLVDS level of 0.8V. In such a manner, the CMOS image sensor illustrated in FIG. 26 is realized.

The "H" level of the input data signal of the differential driver 73 in FIG. 26 is 1.5V, and the "L" level is 0V. One of two output nodes of the differential driver 73 is set to the "H" level (1.0V) and the other output node is set to the "L" level (0V). Therefore, the input/output potential difference of the differential driver 73 becomes 0.5V/−0.8V. Since 0.5V<□−0.8V□, a P-channel MOS transistor is turned on more easily as compared with an N-channel MOS transistor. However, the potential difference of −0.8V is insufficient to turn on a thick-film P-channel MOS transistor. In the differential driver 73, the thin-film P-channel MOS transistors P1 to P4 are used as illustrated in FIG. 13.

In the comparative example, the DC power supply voltage is 3.3V and is high. Consequently, a thin-film P-channel MOS transistor of low threshold voltage cannot be used in place of the thick-film P-channel MOS transistor.

Although the present invention achieved by the inventors herein have been concretely described above on the basis of the embodiments, obviously, the present invention is not limited to the foregoing embodiments and can be variously changed without departing from the gist.

What is claimed is:

1. A solid-state imaging device comprising:
a pixel array;
an AD converting unit converting each of a plurality of analog signals read from the pixel array to a plurality of digital signals and outputting the digital signals;
a transmission mode selection register;
first and second output terminals;
a single-end driver which has first and second input terminals coupled to the digital signals and which has third and fourth terminals and, on the basis of a value of the transmission mode selection register, outputs first and second single-end signals from the third and fourth terminals to the first and second output terminals, respectively; and
a differential driver which has third and fourth input terminals coupled to the digital signals and which has fifth and sixth terminals and, on the basis of a value of the transmission mode selection register, outputs a positive signal and a negative signal constructing differential signals from the fifth and sixth terminals to the first and second output terminals, respectively;
wherein:
the differential driver includes first to fourth P-channel MOS transistors,
sources of the first and second P-channel MOS transistors are coupled to first and second current sources, respectively,
gates of the first and second P-channel MOS transistors are coupled to the third and fourth input terminals, respectively,
drains of the first and second P-channel MOS transistors are coupled to the fifth and sixth terminals, respectively,
sources of the third and fourth P-channel MOS transistors are coupled to the fifth and sixth terminals,
gates of the third and fourth P-channel MOS transistors are coupled to the third and fourth input terminals, respectively, and
drains of the third and fourth P-channel MOS transistors are coupled to third and fourth current sources, respectively,
wherein the single-end driver sets the third and fourth terminals in high-impedance states, on the basis of a value of the transmission mode selection register, when the differential driver outputs the positive signal and the negative signal constructing differential signals from the fifth and sixth terminals to the first and second output terminals, respectively, and
wherein the differential driver disables the first, second, third and fourth current sources, on the basis of a value of the transmission mode selection register, when the single-end driver outputs first and second single-end signals from the third and fourth terminals to the first and second output terminals, respectively.

* * * * *